(12) United States Patent
Hu et al.

(10) Patent No.: US 12,168,727 B2
(45) Date of Patent: Dec. 17, 2024

(54) TRANSPARENT WOOD COMPOSITE, SYSTEMS AND METHOD OF FABRICATION

(71) Applicant: UNIVERSITY OF MARYLAND, COLLEGE PARK, College Park, MD (US)

(72) Inventors: Liangbing Hu, Potomac, MD (US); Mingwei Zhu, Nanjing (CN); Tian Li, West Lafayette, IN (US); Amy S. Gong, Potomac, MD (US); Jianwei Song, College Park, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 21 days.

(21) Appl. No.: 17/734,283

(22) Filed: May 2, 2022

(65) Prior Publication Data

US 2022/0259412 A1    Aug. 18, 2022

Related U.S. Application Data

(62) Division of application No. 16/074,148, filed as application No. PCT/US2017/016490 on Feb. 3, 2017, now abandoned.

(Continued)

(51) Int. Cl.
*C08L 1/02* (2006.01)
*B27K 3/02* (2006.01)
(Continued)

(52) U.S. Cl.
CPC ............. *C08L 1/02* (2013.01); *B27K 3/0207* (2013.01); *B27K 3/15* (2013.01); *C08J 9/26* (2013.01);
(Continued)

(58) Field of Classification Search
CPC ..................................................... B27K 3/0207
See application file for complete search history.

(56) References Cited

U.S. PATENT DOCUMENTS

| | | | | |
|---|---|---|---|---|
| 2,867,543 A | * | 1/1959 | Braun, Jr. | B27K 3/15 427/393 |
| 3,336,959 A | * | 8/1967 | Parks | C08F 263/08 427/325 |

(Continued)

FOREIGN PATENT DOCUMENTS

| | | |
|---|---|---|
| CA | 3006341 | 6/2017 |
| CN | 102216393 A | 10/2011 |
| WO | WO 2017/098149 A1 | 6/2017 |

OTHER PUBLICATIONS

Ha et al, Adv. Energy Mater, 2014, 4, 1301804 (Year: 2014).*

(Continued)

*Primary Examiner* — Irina Krylova
(74) *Attorney, Agent, or Firm* — Rowan Tree Law Group, PLLC; Frederick F. Rosenberger

(57) ABSTRACT

Highly transparent (up to 92% light transmittance) wood composites have been developed. The process of fabricating the transparent wood composites includes lignin removal followed by index-matching polymer infiltration resulted in fabrication of the transparent wood composites with preserved naturally aligned nanoscale fibers. The thickness of the transparent wood composite can be tailored by controlling the thickness of the initial wood substrate. The optical transmittance can be tailored by selecting infiltrating polymers with different refractive indices. The transparent wood composites have a range of applications in biodegradable electronics, optoelectronics, as well as structural and energy efficient building materials. By coating the transparent wood (Continued)

composite layer on the surface of GaAs thin film solar cell, an 18% enhancement in the overall energy conversion efficiency has been attained.

6 Claims, 22 Drawing Sheets

Related U.S. Application Data

(60) Provisional application No. 62/291,151, filed on Feb. 4, 2016.

(51) Int. Cl.
  B27K 3/15        (2006.01)
  C08J 9/26        (2006.01)
  C08J 9/42        (2006.01)
  H01L 31/0216     (2014.01)
  H01L 31/0304     (2006.01)
  H01L 31/18       (2006.01)

(52) U.S. Cl.
  CPC .......... *C08J 9/42* (2013.01); *H01L 31/02168* (2013.01); *H01L 31/0304* (2013.01); *H01L 31/184* (2013.01); *B27K 2240/10* (2013.01); *C08J 2201/0422* (2013.01); *C08J 2301/02* (2013.01)

(56) References Cited

U.S. PATENT DOCUMENTS

| | | | | |
|---|---|---|---|---|
| 3,968,318 | A * | 7/1976 | Betty | B27K 3/15 427/393 |
| 4,331,052 | A | 5/1982 | Neff | |
| 4,347,101 | A * | 8/1982 | Villavicencio | D21B 1/12 162/28 |
| 4,661,205 | A * | 4/1987 | Ow | D21C 9/163 162/88 |
| 7,364,795 | B2 | 4/2008 | Daly et al. | |
| 8,012,573 | B2 | 9/2011 | Kowata et al. | |
| 8,372,764 | B2 | 2/2013 | Yano et al. | |
| 2002/0129912 | A1* | 9/2002 | Reinhard | D21C 9/163 162/76 |
| 2004/0177937 | A1* | 9/2004 | Patt | D21C 3/06 162/77 |
| 2008/0032037 | A1 | 2/2008 | Frey et al. | |
| 2010/0068543 | A1* | 3/2010 | Hayward | C08H 8/00 427/393 |
| 2011/0056555 | A1* | 3/2011 | Keller | B32B 17/10761 136/256 |
| 2016/0010279 | A1 | 1/2016 | Hu et al. | |
| 2018/0370071 | A1 | 12/2018 | Boitouzet et al. | |

OTHER PUBLICATIONS

Vacuum Pressures Unit Conversion Chart (Year: 2017).*
Refractive Index of Polymers, flyer (Year: 2024).*
Abstract for Yano et al., "High Strength Wood-based Materials," *Cellulose Commun.*, 2003, 10(1): pp. 23-27. (6 pages).
Callahan, "Wooden Windows? New material could replace glass in solar cells and buildings," Mar. 31, 2016. PCT ISA/US Retrieved from the Internet Mar. 30, 2017 (Mar. 30, 2017). URL: <http://www.kth.se/en/forskning/artiklar/kth-forskare-har-uppfunnit-genomskinligt-tra-1.638511>. (3 pages).
Chung, "The incredible possibilites of invisible wood," CNN Updated Aug. 2016, PCT ISA/US Retrieved from the internet Mar. 30, 2017 (Mar. 30, 2017). URL: <http://www.cnn.com/2016-05-23/architecture/clear-wood-architecture/>. (3 pages).
Fang et al., "Highly transparent paper with tunable haze for green electronics," *Energy and Environmental Science*, 2014, DOI: 10.1039/c4ee02236j. (7 pages).
Fang et al., "Novel Nanostructured Paper with Ultrahigh Transparency and Ultrahigh Haze for Solar Cells," *Nano Letters*, 2014, 14: pp. 765-773. (9 pages).
Fink, Siegfried, "Transparent Wood—A New Approach in the Functional Study of Wood Structure," *Holzforschung: International Journal of the Biology, Chemistry, Physics and Technology of Wood*, Jan. 1992, 46(5): pp. 403-408. (6 pages).
Fukuzumi et al., "Transparent and High Gas Barrier Films of Cellulose Nanofibers Prepared by TEMPO-Mediated Oxidation," *Biomacromolecules*, 2009, 10: pp. 162-165. (4 pages).
Galland et al., "Holocellulose Nanofibers of High Molar Mass and Small Diameter for High-Strength Nanopaper," *Biomacromolecules*, 2015, 16: pp. 2427-2435. (9 pages).
Hakansson et al., "Hydrodynamic alignment and assembly of nanofibrils resulting in strong cellulose filaments," *Nature Communications*, 2014, DOI: 10.1038/ncomms5018. (10 pages).
Horiuchi N., "Nanostructured Paper," *Nature Photonics*, 2014, 8: p. 172. (1 page).
International Search Report and Written Opinion, mailed Apr. 21, 2017, in International Application No. PCT/US17/16490. (6 pages).
Jia et al., "Scalable, anisotropic transparent paper directly from wood for light management in solar cells," *Nano Energy*, 2016, 36: pp. 366-373.
Li et al., "Lignin-Retaining Transparent Wood," *ChemSusChem*, 2017, 10: pp. 3445-3451. (7 pages).
Li et al., "Luminescent Transparent Wood," *Advanced Optical Materials*, 2016, DOI: 10.1002/adom.201600834. (5 pages).
Li et al., "Optically Transparent Wood from a Nanoporous Cellulosic Template: Combining Functional and Structural Performance," *Biomacromolecules*, 2016, 17: pp. 1358-1364. (7 pages).
Nogi et al., "Optically Transparent Nanofiber Paper," *Advanced Materials*, 2009, 21: pp. 1595-1598. (4 pages).
Office Action, issued Sep. 10, 2019 (Sep. 10, 2019), in European Application No. 17748268.4. (11 pages).
Office Action, issued Jun. 2, 2020 (Jun. 2, 2020), in Chinese Application No. 201780015389.9. (23 pages).
Office Action, issued Jan. 5, 2021 (Jan. 5, 2021), in Japanese Application No. 2018-540764. (12 pages).
Office Action, issued Apr. 8, 2021 (Apr. 8, 2021), in Chinese Application No. 201780015389.9. (9 pages).
Office Action, issued Apr. 20, 2021 (Apr. 20, 2021), in Japanese Application No. 2018-540764. (10 pages).
Office Action, issued Aug. 3, 2021 (Aug. 3, 2021), in Japanese Application No. 2018-540764. (11 pages).
Office Action, issued Feb. 3, 2022 (Feb. 3, 2022) in U.S. Appl. No. 16/074,148. (25 pages).
Okahisa et al., "Optically transparent wood-cellulose nanocomposite as a base substrate for flexible organic light-emitting diode displays," *Composites Science and Technology*, Sep. 2009, 69(11-12): pp. 1958-1961. (4 pages).
Siro et al., "Highly Transparent Films from Carboxymethylated Microfibrillated Cellulose: The Effect of Multiple Homogenization Steps on Key Properties," *Journal of Applied Polymer Science*, 2011, 119: pp. 2652-2660. (9 pages).
Tang et al., "A Transparent, Hazy, and Strong Macroscopic Ribbon of Oriented Cellulose Nanofibrils Bearing Poly(ethylene glycol)," *Advanced Materials*, 2015, DOI: 10.1002/adma.201404565. (7 pages).
Third Party Observation on International Application No. PCT/US17/16490, submitted to International Bureau on Jun. 4, 2018. (2 pages).
Vasileva et al., "Transparent wood as a novel material for non-cavity laser," *Asia Communications and Photonics Conference (ACP)*, 2016. (3 pages).
Yano et al., "Effects of the removal of matrix substances as a pretreatment in the production of high strength resin impregnated wood based materials," *Journal of Materials Science Letters*, 2001, 20: pp. 1125-1126. (2 pages).
Zhu et al., "Anisotropic, Transparent Films with Aligned Cellulose Nanofibers," *Advanced Materials*, 2017, DOI: 10.1002/adma.201606284. (8 pages).
Zhu et al., "Highly Anisotropic, Highly Transparent Wood Composites," *Advanced Materials*, 2016, DOI: 10.1002/adma.201600427. (7 pages).

(56) References Cited

OTHER PUBLICATIONS

Zhu et al., "Transparent nanopaper with tailored optical properties," *Nanoscale*, 2013, 5: pp. 3787-3792. (6 pages).
CA Office Action, issued Feb. 10, 2023 (Feb. 10, 2023), in Canadian Application No. 3,013,575. (4 pages).

* cited by examiner

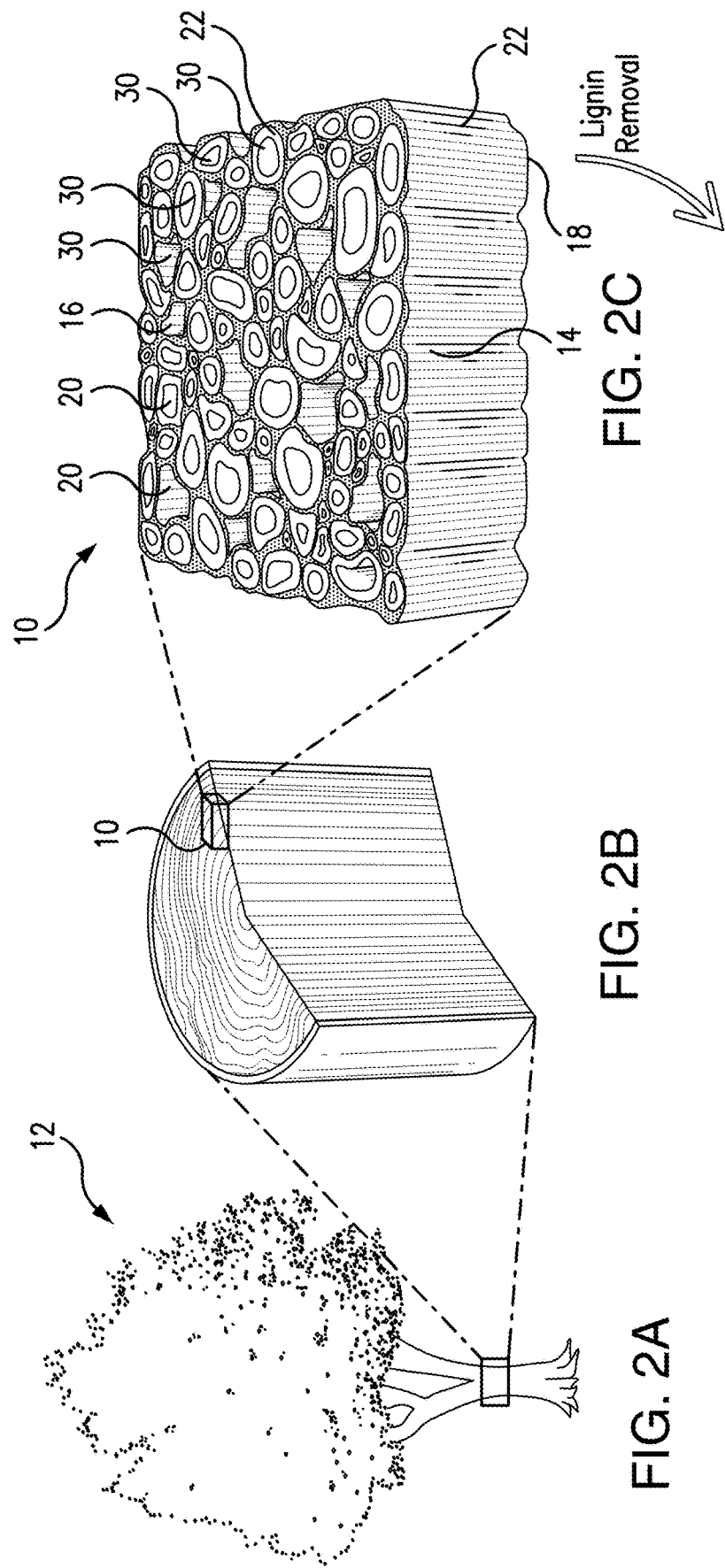

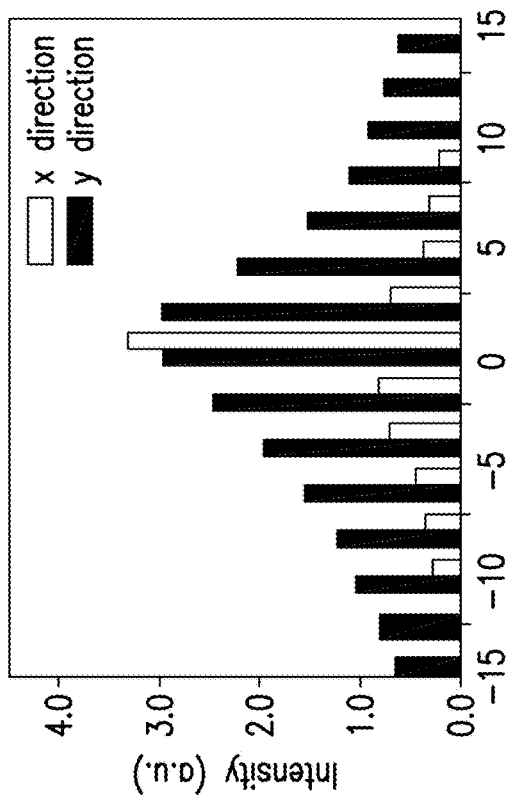
FIG. 4E
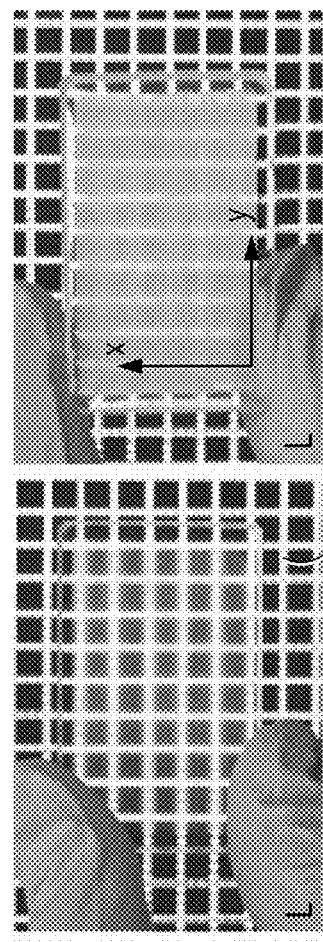
FIG. 4G
FIG. 4H
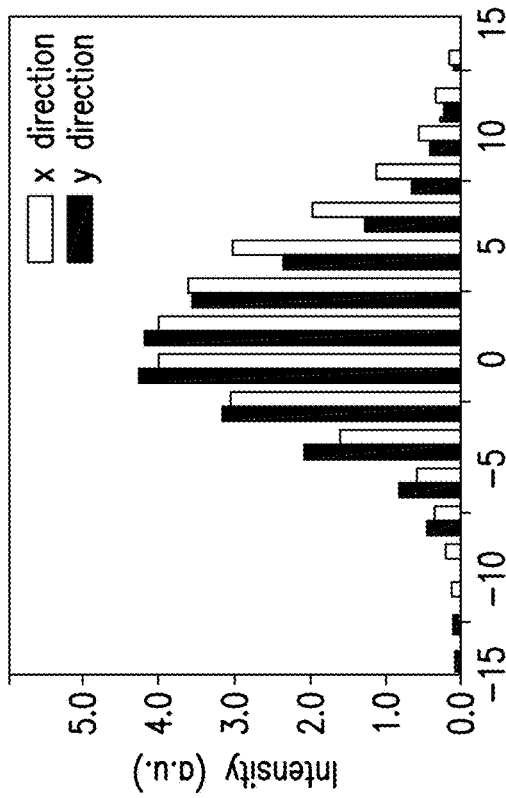
FIG. 4F
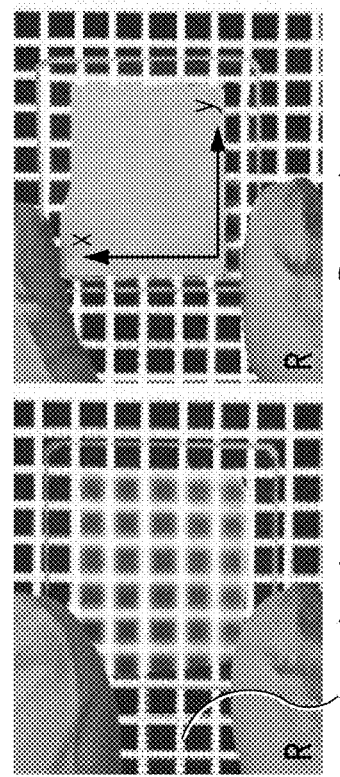
FIG. 4I
FIG. 4J

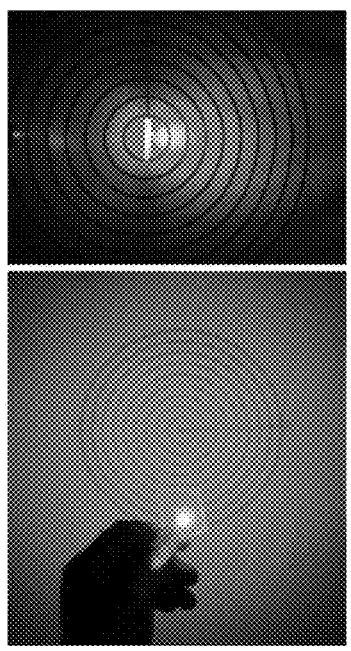
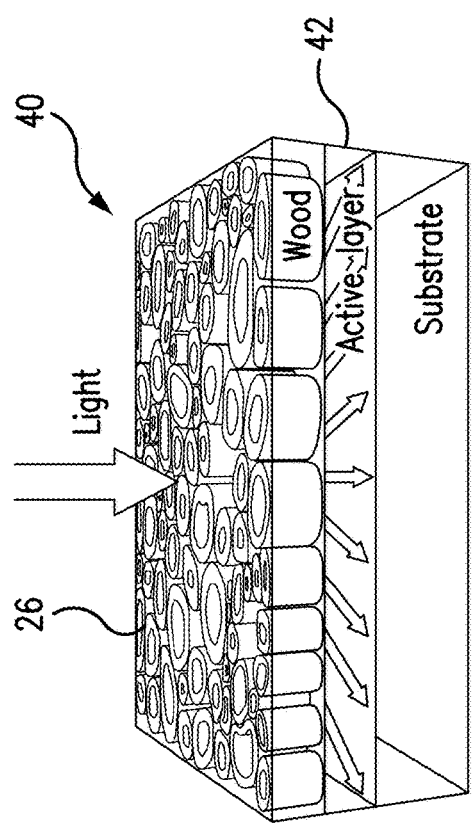
FIG. 9A
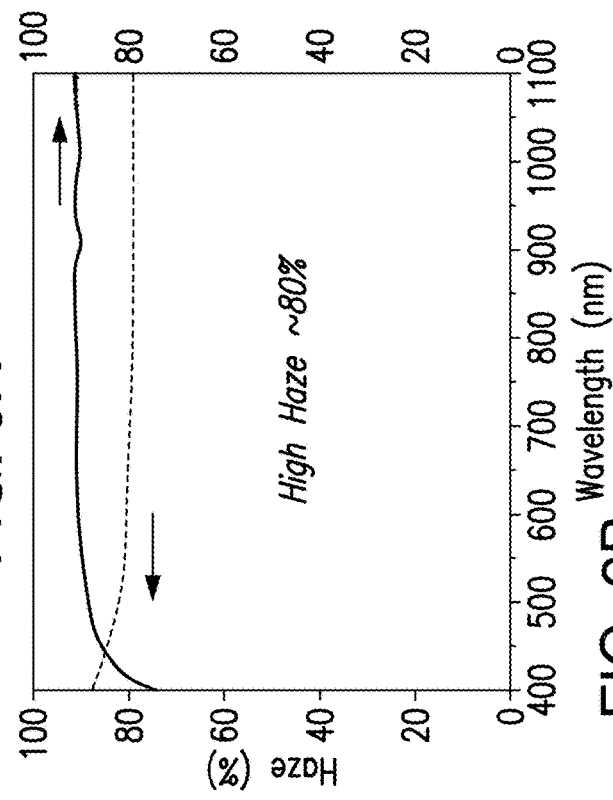
FIG. 9B
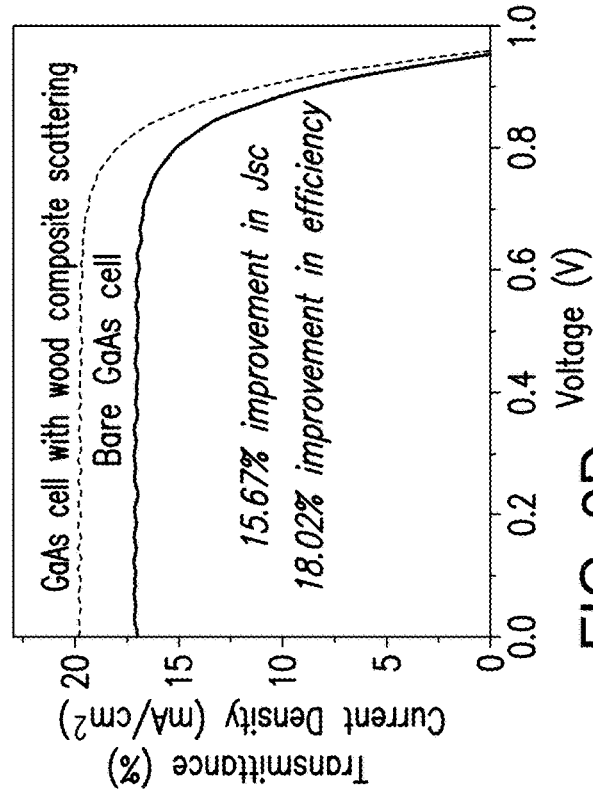
FIG. 9C
FIG. 9D

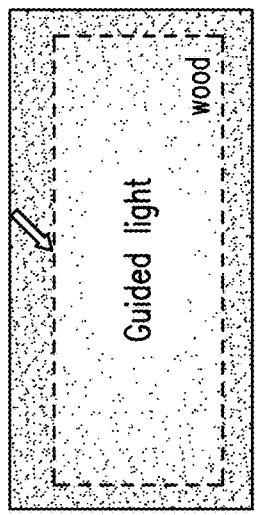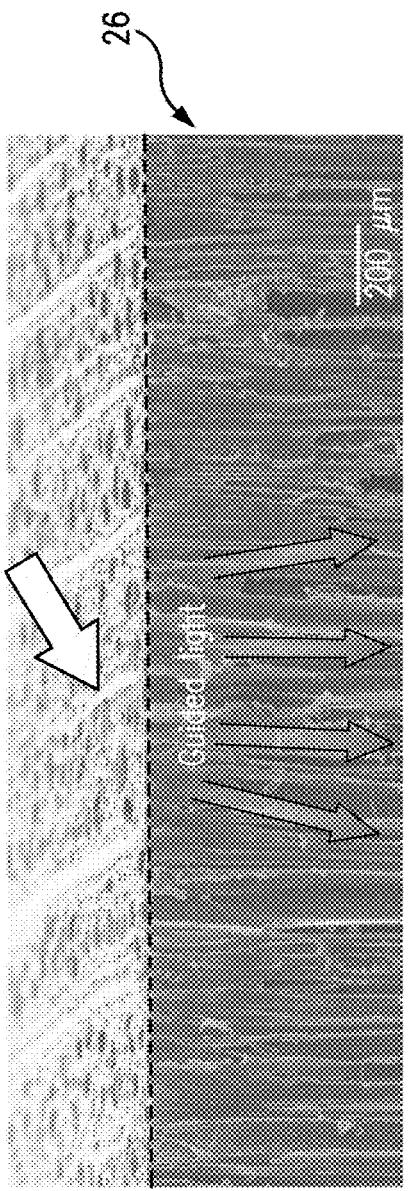
FIG. 11A
FIG. 11B
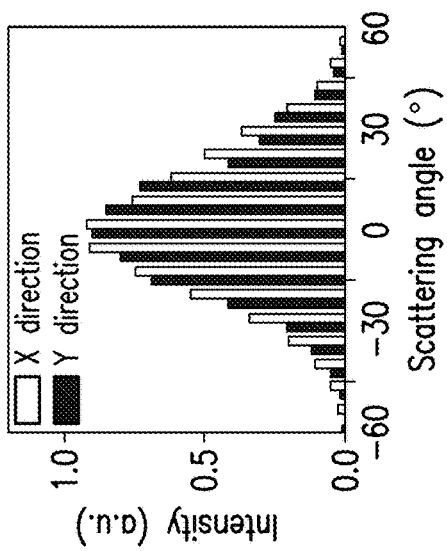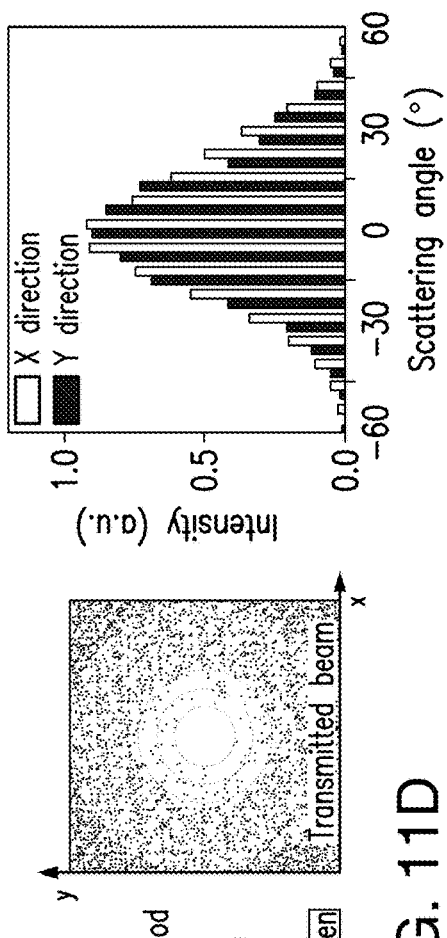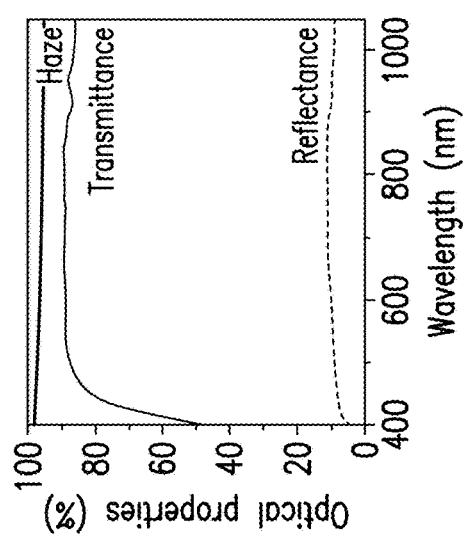
FIG. 11C
FIG. 11D
FIG. 11E

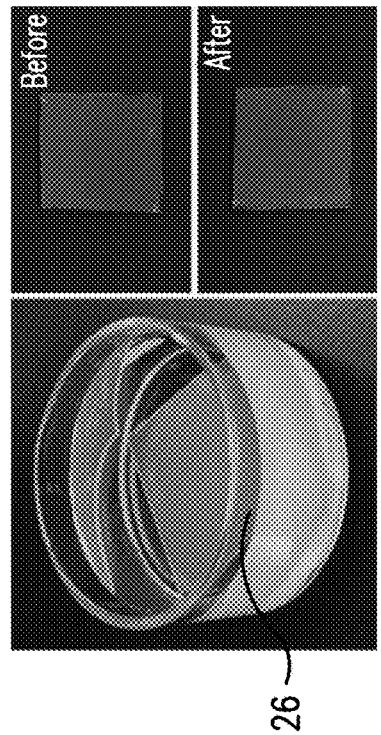
FIG. 14C
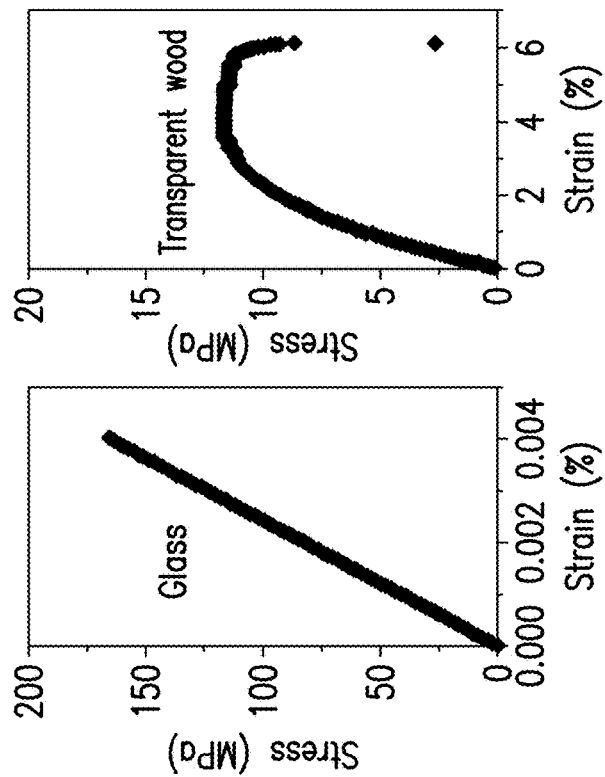
FIG. 14B
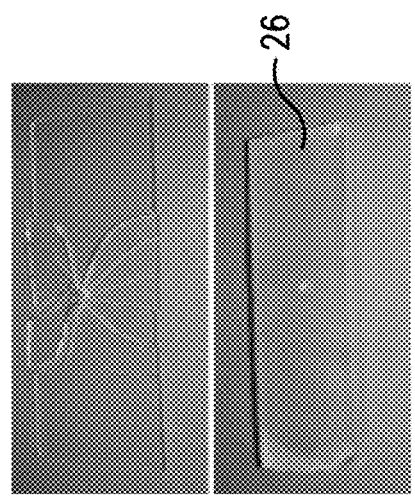
FIG. 14A
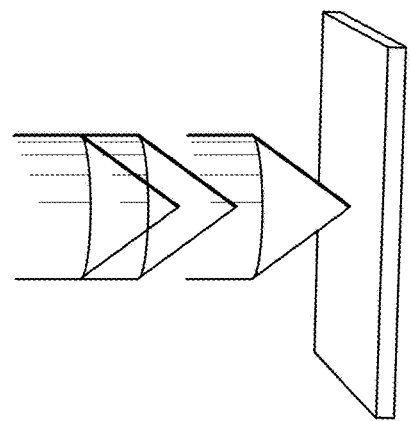

TRANSPARENT WOOD COMPOSITE, SYSTEMS AND METHOD OF FABRICATION

STATEMENT REGARDING FEDERAL SPONSORED RESEARCH OR DEVELOPMENT

This invention was made with government support under FA9550-13-1-0143 awarded by the Air Force Office of Scientific Research. The government has certain rights in the invention.

REFERENCE TO RELATED APPLICATION(S)

This Utility Patent Application is based on the Provisional Patent Application No. 62/291,151 filed 4 Feb. 2016.

FIELD OF THE INVENTION

The present invention is directed to light transmitting systems, and in particular to wood-based light transmitting systems.

Even more in particular, the present invention is directed to anisotropic transparent wood mesoporous composites having unique optical properties in a broad wavelength range between 400 nm and 1100 nm which can be utilizable for a wide range of optoelectronic and photonic systems, where light management is crucial for enhanced operation efficiency. The systems provide for high mechanical strength and ductility and may be used as energy efficient building materials for guided sunlight transmittance and effective thermal insulation.

The present invention is also directed to a method of fabrication of transparent wood composites in a two stage process, including extraction of lignin from low tortuosity channels of the natural wood (in the first stage) followed by the second stage for infiltrating of lignin-devoid wood blocks with material(s) having refractive index substantially matching the refractive index of the channel walls' cellulose-containing material.

In addition, the present invention is directed to optoelectronic systems using a broad range light management layer formed with anisotropic transparent wood composite(s) fabricated in a cost-efficient manner.

The present invention is further directed to energy efficient building materials for guided sunlight transmittance and effective thermal insulation using transparent wood composites which, when installed as a replacement of windows and/or rooftops, efficiently harness light for consistent and uniform indoor lighting.

BACKGROUND OF THE INVENTION

Wood is a widely used structural material that has excellent mechanical properties due to the unique structures developed during its natural growth. Depending on their types and geographical differences, different woods display a wide variety of mesostructures. For example, soft woods typically have a more porous structure due to their fast growth. Hard woods normally have a more dense structure and a higher density compared to soft wood. Although the large-scale structures in different woods can be dramatically different, the mesoporous structures of wood share similarities in their hierarchical structures.

An outstanding feature of woods is their structural anisotropy due to the existence of numerous aligned natural internal channels. Vertically aligned internal channels in the trunk of trees are used to pump ions, water and other ingredients through the wood trunk to meet the need of trees for photosynthesis.

Typical wood is mainly composed of cellulose and hemicellulose fibers, and lignin. Wood cell nano- and microfibers are naturally aligned along the growth direction and form walls of the internal channels. The fibers' dimensions are typically from 3 mm to 5 mm in length and from less than 10 µm to 50 µm in diameter. The alignment of cellulose nanofibers together with the strong interactions among the biopolymers in wood is enhanced by lignin which acts as a matrix adhesive, forming a typical fiber reinforced, anisotropic mesostructure. Each wood cell fiber contains multiple microfibers and each microfiber can further be broken down into nanosized fibers. Wood is either directly used as a structural material or as the rich source from which cellulose microfibers are extracted to make non-transparent paper, which is used widely in everyday life.

Recently, researchers have begun to look into emerging applications of biopolymers from wood, especially cellulose nanofibers (CNF) and cellulose nanocrystals (CNC). CNF and CNC are extremely attractive for a broad range of new applications including green electronics, energy storage and biological devices. Simultaneously, lignin, which is a byproduct of the pulping process, has been explored as a potential low cost material for making high-performance carbon or energy storage electrodes.

Natural wood is not transparent for mainly two reasons. First, natural wood has microsized channels that scatter light in the visible range. Second, lignin infiltrating wood (up to 30% by mass) absorbs visible light and leads to the opaque appearance of most woods.

Two major components in wood, cellulose and hemicellulose, are insulating polymers with extremely low light absorption. Their optical transmittance can be tailored to be as clear as plastic and glass, or be hazy for different applications. However, extracting CNF from wood is an energy and time consuming process.

Light management is critical for improving the optoelectronic devices. For example, a range of light trapping strategies have been developed, such as nano-cone structures, nano-dome arrays, nano-tube lattices, nanowires, as well as metallic nanoparticles, which increase the light transport path in the active layers to effectively increase energy conversion efficiencies in devices. Bio-inspired approaches have also been used to design advanced nanostructures for light trapping.

Transparent optical material is one of the most important building blocks for solar-based energy conversion devices, where glass has long been the traditional material. To enable flexibility of optical systems, plastic has been explored with success as a glass replacement for optical device integrations. However, plastic substrates have intrinsic problems such as poor thermal stability, difficulty in being functionalized, and adding waste to landfills. Mesoporous wood fibers in nature directed to photonics is desirable due to its abundance, unique hierarchical structure, rich surface chemistry and use of well-developed processing of wood. Built by nature, wood has unique mesostructures that can lead to advantageous properties such as excellent mechanical strength and efficient transport of water and ions.

As promoted by the U.S. Department of Energy (DOE), energy consumption of buildings is to be reduced by 20% by 2020, and 50% as the long-term goal. Energy used for lighting and thermal comfort contributes to more than 50% of the total energy consumption in residential and commercial buildings. Consequently, conserving air conditioning and lighting usage especially during daytime can yield substantial savings. Sunlight is the best, most natural light for most daily living needs. Windows play a key role in energy management within buildings. Glass is the most commonly used material for windows for sunlight harvesting. However, glass windows suffer from the following problems:

(1) Glass often creates shadowing effects and discomforting glare. To create efficient, uniform, and consistent indoor lighting inside the building, the light harvesting window needs to yield effective directional scattering including a high transparency over visible range and a large scattering effect in the forward direction. Current strategies used to realize directional scattering often involve complex nanostructures based on Mie scattering or other resonant scattering effects where the size of the nanostructures must be finely tuned. Consequently, such techniques show limited capability for large-scale commercial applications.

(2) Due to the intrinsic high thermal conductivity of glass, one-third of the energy used to heat or cool the building is lost through inefficient glass windows.

(3) Glass is highly brittle and shatters upon sudden impact, which can lead to safety issues.

In contrast to glass, wood is a natural thermal insulator with excellent mechanical strength, which has been used as a structural material for houses and cabins for thousands of years. It is the hierarchical structure and the strong interactions among cellulose, hemicellulose and lignin that leads to excellent mechanical properties in wood. However, natural wood is not transparent due to light absorbing lignin and microsized scattering cell lumens.

If wood could be fabricated in a manner to make it transparent, it would find its usefulness in a wide range of applications from everyday uses (such as, for example, wood furniture) to more advanced applications (such as structural materials in automobiles, as building materials, and in optoelectronics, etc.).

It would be highly desirable to fabricate, in a cost-efficient manner, wood based light management materials as an attractive platform for optoelectronic devices with highly efficient broadband light management to enhance the light trapping inside active layer in energy conversion devices (such as, for example, thin film solar cells and photoelectric chemical cells), and to fabricate transparent and translucent wood composites which would be useful as energy efficient building materials for daylight harvesting and thermal insulation.

SUMMARY OF THE INVENTION

It is therefore an object of the present invention to provide a transparent wood composite material which is fabricated in a cost effective manner and displays extra-ordinary anisotropical optical and mechanical properties which can be used as wood-based light management material in optoelectronics, for numerous energy conversion devices (such as, for example, thin film solar cells and photoelectric chemical cells), as well as for use as a building material to efficiently harvest sunlight to provide consistent and uniform indoor lighting.

Transparent wood composites have been fabricated for the first time by the novel two-stage fabrication process by removing lignin from a wood block pre-cut from natural block, followed by infiltrating the lignin-devoid wood block with index-matching polymer(s) to achieve high optical transparency of the wood block. Depending on the direction of the wood block cut, different types of transparent wood composite material can be fabricated where the natural internal channels in wood align either perpendicularly to the wood cut plane, or along the wood cut plane, or in other angled relationships therebetween.

The structure-process-properties relationship has been studied in two types of the subject wood composites, and it was found that the fabrication processes for the cross-cut and longitudinally cut wood samples require different fabrication regimes due to the distinct kinetics of the lignin removal and polymer infiltration along the open internal channels in the cross-cut and longitudinally-cut samples. The resulting wood composites maintain the original alignment structure of cellulose inside the cell (channels) walls and display extraordinary anisotropic optical and mechanical properties.

In one aspect, the present invention is directed to a transparent wood composite which comprises:
  a wood block of predetermined dimensions pre-cut from a natural wood in a predetermined angular relationship to a direction of natural internal channels of the natural wood and treated to remove therefrom the natural wood's lignin, and
  a filling polymer having refractive index substantially matching the refractive index of the cellulose-containing material of the internal channels' walls, and substantially completely infiltrating the internal channels of the lignin-devoid wood block.

The pre-cut wood block is configured with an upper and a bottom cut planes spaced apart one from another a predetermined distance of 100 µm or larger, for example, ranging approximately between 100 µm and 1.4 cm for different applications. At least one of the upper and bottom cut planes extends in crossing relationship with the natural internal channels or substantially therealong, or in other angular relationship therebetween.

The filling polymer has refractive index close to the refractive index of cellulose, i.e., 1.48, and specifically, is chosen to have a refractive index of approximately 1.53 at the light wavelength of $\lambda=550$ nm.

The filling polymer may be selected from a large group of materials including:
  Thermosetting polymers, such as, for example, Polyester fiberglass, Polyurethanes polymers, Vulcanized rubber, Bakelite, Duroplast, Urea-formaldehyde, Melamine resin, Diallyl-phthalate (DAP), Polyimides and Bismaleimides, Cyanate esters or polycyanurates, Furan resins, Polyester resins, Silicone resins, Benzoxazine resins, Bis-Maleimides (BMI), Cyanate ester resins, Epoxy (Epoxide) resins, Phenolic (PF) resins, Polyester resins, Polyimides, Polyurethane (PUR) resins, Silicone Resins, Vinyl ester resins,
  Thermoplastic polymers, such as, for example, Acrylic, ABS, Nylon, PLA, Polybenzimidazole, Polycarbonate, Polyether sulfone, Polyetherether ketone, Polyetherimide, Polyethylene, Polyphenylene oxide, Polyphenylene sulfide, Polypropylene, Polystyrene, Polyvinyl chloride, Teflon,
  Cellulose derivatives, such as, for example, Cellulose acetate, Cellulose acetate butyrate, Cellulose triacetate, Methyl cellulose, Hydroxypropyl methyl cellulose, Ethyl cellulose, Hydroxyethyl cellulose, Carboxymethyl cellulose, Dissolved cellulose, Nanofibrillated cellulose, Cellulose nanocrystals,
  functional index matching materials, such as, for example, liquid crystal, pressure/temperature sensing materials, piezoelectric materials, as well as colorless polymer nano-glue, transparent liquid epoxy resin precursor with low viscosity, a mixture of a resin with non-blushing cycloaliphatic hardener, polyvinylpyrrolidone (PVP), Poly(methyl methacrylate) (PMMA), Poly(vinyl alcohol) (PVA), Polydimethylsiloxane (PDMS), etc.

In another aspect, the present invention is directed to a wood-based light transmitting system, which comprises at least one transparent wood composite member formed from at least one wood block pre-cut from a natural wood in a predetermined angular relationship to a direction of natural internal channels in the natural wood and treated to remove lignin therefrom, thus forming lignin-devoid wood block, and a filling polymer having refractive index substantially matching the refractive index of the cellulose-containing material of the natural internal channels' walls and substantially fully infiltrating the natural internal channels in the lignin-devoid wood block.

The transparent wood composite member has an upper and a bottom planes. The predetermined angular relationship constitutes an angle, for example, of approximately 90° between the direction of the internal channels and at least one of the upper and bottom planes of the transparent wood composite member. Alternatively, the upper and/or bottom planes are cut in a direction substantially coinciding with the direction of the natural internal channels in the transparent wood composite member. Other angular relationship between 0° and 90° between the wood block's planes and the direction of the interval channels also is contemplated in the subject system and method.

The transparent wood composite member may be configured as a thick or thin block or a layer having a length of 1 mm or larger, a width of 1 mm or larger, and a thickness of 100 μm or larger.

The resulting transparent wood composite member has light transmittance, ranging approximately from 80% to 95%, and an optical haze ranging approximately from 80% to 100% in the visible light wavelength range from 400 nm to 1100 nm. The optical properties depend, although not exclusively, on the choice of the infiltrating materials.

The subject wood-based light transmitting system may form an optoelectronic system with an advanced light management, including at least one of photonic systems, solar cells, photo-detectors, displays, and wide-angle lighting systems.

When used in a solar cell which includes an optically active layer, the transparent wood composite member (shaped as a thin layer having a thickness ranging between 100 μm and 3 mm) is disposed in optical contact with the optically active layer. Light incident onto the transparent wood composite member is scattered along the light path therethrough prior to reaching the optically active layer in the solar cell.

Alternatively, the subject wood-based light transmitting system may be used as a light-harvesting building structure having a high mechanical strength with a fracture strength of 23.5-45 MPa and high ductility of the fabricated transparent wood composite member. The mechanical properties depend, although not exclusively, on the choice of the infiltrating materials.

In an additional aspect, the present invention is directed to a method of fabrication of wood based light transmitting systems which comprises the steps of:

fabricating a transparent wood composite member by:
(a) pre-cutting a wood block from a natural wood in a pre-determined angular relationship to natural internal channels of the natural wood, where the natural internal channels have walls formed from cellulose-containing material and filled with lignin, (b) substantially completely removing the lignin from natural internal channels of the wood block, thus forming the lignin-devoid wood block, and (c) upon the lignin removal, infiltrating the natural internal channels in the lignin-devoid wood block with a filling polymer having refractive index substantially matching a refractive index of the cellulose-containing material of the internal channels' walls.

In the step (b), the subject fabrication process assumes:
preparing a lignin removal solution by mixing a solution of NaOH having a concentration of 2.5 mol/L in deionized water, and a solution of $Na_2SO_3$ having a concentration of 0.4 mol/L in deionized water;

immersing and boiling the pre-cut wood block in the lignin removal solution for approximately 12 hours, rinsing the pre-cut wood block in hot distilled water, immersing and boiling (avoiding stirring) the rinsed pre-cut wood block in a bleaching solution containing 2.5 mol/L of $H_2O_2$ in distilled water until a color of the pre-cut wood block disappears, thus obtaining a lignin-devoid wood block, rinsing the colorless lignin-devoid wood block with cold water, and preserving the colorless lignin-devoid wood block in ethanol solvent. Other lignin removal chemicals (widely used in paper making industry) include, but not limited to $NaOH+Na_2SO_4$ (boil) $(+H_2O_2)$, NaClO, $H_2O_2$, $NaClO_2$+Acetic Acid, NaOH $(+H_2O_2)$, NaOH+$Na_2S$ $(+H_2O_2)$, $Na_2S_2O_4+ZnS_2O_4$, $ClO_2$, $CH_3COOOH$, $H_2SO_5$, $CH_3COOOH+H_2SO_5$.

In the step (c), the subject fabrication process further includes:

immersing the lignin-devoid wood block in the filing polymer in the liquid phase thereof, degassing the liquid filing polymer under pressure of approximately 200 Pa for approximately 5-10 minutes to remove a gas and ethanol solvent from the lignin-devoid wood block, applying the atmosphere pressure to the liquid filling polymer to promote the internal channels infiltration process, repeating the atmosphere pressure application a predetermined number of times, thus obtaining the polymer infiltrated wood block immersed in the liquid filling polymer, maintaining the polymer infiltrated wood block in the filling polymer undisturbed at approximately 30° C.-60° C. for approximately 12 hours until the liquid filling polymer solidifies, and peeling the polymer infiltrated wood block from the solidified filling polymer, thus obtaining the transparent wood composite member.

The subject method further contemplates the steps of:
placing the transparent wood composite member on an optically active layer of a solar cell in contagious contact therewith, thus forming a sandwich structure, and drying the sandwich structure at room temperature to firmly attach the transparent wood composite member to the solar cell.

The subject method also contemplates the step of:
attaching the transparent wood composite member to a building at a site of at least one window or a rooftop to serve as an energy efficient building material that is capable of providing an improved thermal insulation and daytime light harvesting.

BRIEF DESCRIPTION OF THE DRAWINGS

FIG. 1A depicts wood blocks pre-cut in cross-direction (R-wood) and longitudinal direction (L-wood); FIGS. 1B and 1C show the internal channels in R-wood and L-wood, respectively, FIGS. 1D and 1E show SEM images of the internal channels in R-wood and L-wood, respectively, FIG. 1F depicts schematically the lignin removal stage of the subject fabrication process, FIGS. 1G and 1H depicts the color change of the wood block during the lignin removal (Processes I) and bleaching routine (Process II) respectively, and FIGS. 1I and 1J are diagrams corresponding to lignin content vs. time in processes I and II, respectively;

FIGS. 2A-2E show schematically the subject process of fabrication of the cross-cut transparent wood composite, where FIG. 2A shows a natural wood, FIG. 2B shows a pre-cut slice of the natural wood, FIG. 2C shows (on a somewhat enlarged scale) a lignin-filled wood block cut out in the crossing direction relative to the internal channels from the wood block of FIG. 2B, FIG. 2D shows the wood slice of FIG. 2C, where lignin is removed, FIG. 2E shows the step of polymer infiltration.

FIG. 3A is an SEM image of the lignin-devoid wood block, FIG. 3B is a zoom-in lignin-devoid SEM image of FIG. 3A, FIG. 3C is an SEM image of the aligned cellulose nanofibers, and FIG. 3D is an SEM image of a polymer filled wood composite;

FIGS. 4A-4L illustrate comparison between the transparent wood composite precut in cross direction (R-wood) to the inner channels and in longitudinal direction (L-wood) along the inner channel, where FIGS. 4A and 4B show the transmittance measurements setups with two different anisotropic structures (cross and longitudinal directions) of the transparent wood, respectively, FIGS. 4C and 4D are photo images of the scattered light spot for R-wood and L-wood, respectively, FIGS. 4E and 4F are diagrams representative of the intensity distribution in X and Y directions in correspondence to FIGS. 4C and 4D, respectively, FIGS. 4G and 4H show the transparent R-wood sample placed directly on the grids and 5 mm above the grids, respectively, FIGS. 4I and 4J show the L-wood sample placed directly on the grids and 5 mm above the grids, respectively, FIG. 4K is a diagram representative of the total transmittance for the natural R-wood, natural L-wood, transparent R-wood and transparent L-wood, respectively, and FIG. 4L is a diagram representative of the optical haze of the R- and L-wood composites, respectively;

FIGS. 5A and 5B illustrate mechanical forces applied to transparent R-wood and transparent L-wood members, respectively, FIG. 5C is a diagram representative of the experimental stress-strain curves for the natural R-wood and transparent R-wood samples, respectively, FIG. 5D is a diagram representative of the experimental stress-strain curves for natural L-wood and transparent L-wood samples, respectively, FIGS. 5E and 5F show SEM images of cross section of the natural R-wood and natural L-wood after the fracture of the stress-strain test, respectively, and FIGS. 5G and 5H show the SEM image of the cross section of the transparent R-wood composite and transparent L-wood composite samples, respectively, after the fracture of the stress-strain test;

FIG. 6A is a cross section of the wood block showing open channels filled with lignin, FIG. 6B is an SEM image of the cross section of the wood slice where the lignin is removed (the resulting white wood is shown as an inset), FIG. 6C shows a cross section of the wood slice where the lignin is replaced by the refractive index matching polymer (the resulting transparent wood shown as an inset), FIG. 6D is a side view of the untreated R-wood highlighting the alignment of the internal microchannels, FIG. 6E is an SEM image showing the densely aligned CNF in the cell wall of the microfibers, and FIG. 6F is an SEM image showing the fibers of FIG. 6E, which have been randomly distributed after further processing to have a higher contrast showing the aligned fibers broken down into a randomly distributed network;

FIG. 7A shows a non-transparent wood block, FIG. 7B shows a transparent wood composite member with a thickness of 1 mm, and FIG. 7C is a diagram representative of comparison of the total defused transmittance of the regional natural wood and the transparent wood composite;

FIGS. 9A-9B demonstrate the haze characteristics of the transparent wood composite sample and its application to GaAs solar cell, where FIG. 9A shows the light scattering by the transparent wood composite, FIG. 9B is a diagram representative of the transmittance and haze, respectively, of the transparent wood composite sample used in the experiment, FIG. 9C is a schematic representation of distribution of the light incident on a solar cell using the wood transparent composite attached to the active layer, and FIG. 9D is a diagram representative of the current density vs. voltage characteristics for the bare GaAs cell and the GaAs cell with the light management transparent wood composite coating, respectively;

FIG. 11A is a SEM image of the transparent wood microstructure, FIG. 11B is a top view of the guided light propagation in a thick transparent wood composite block, FIG. 11C is a diagram representative of a high transmittance and low reflectance with effective broadband forward scattering in the visible wavelength range through the 0.5 cm thick transparent wood window, FIG. 11D shows the transmitted beam pattern of a 45° laser beam incident on the transparent wood composite sample, and FIG. 11E shows a diagram of the intensity of the light vs. the scattering angle in X and Y directions;

FIG. 14A depicts an impact test of a piece of standard glass in comparison with the transparent wood composite of the similar thickness, FIG. 14B depicts diagrams of the strain-stress curves of the transparent wood composite and glass, respectively, and FIG. 14C is photographic evidence that the transparent wood composite sample is water resistant and exhibits no obvious change after 72 hours immersion in water.

DETAILED DESCRIPTION OF THE PREFERRED EMBODIMENT

Figure 1A:
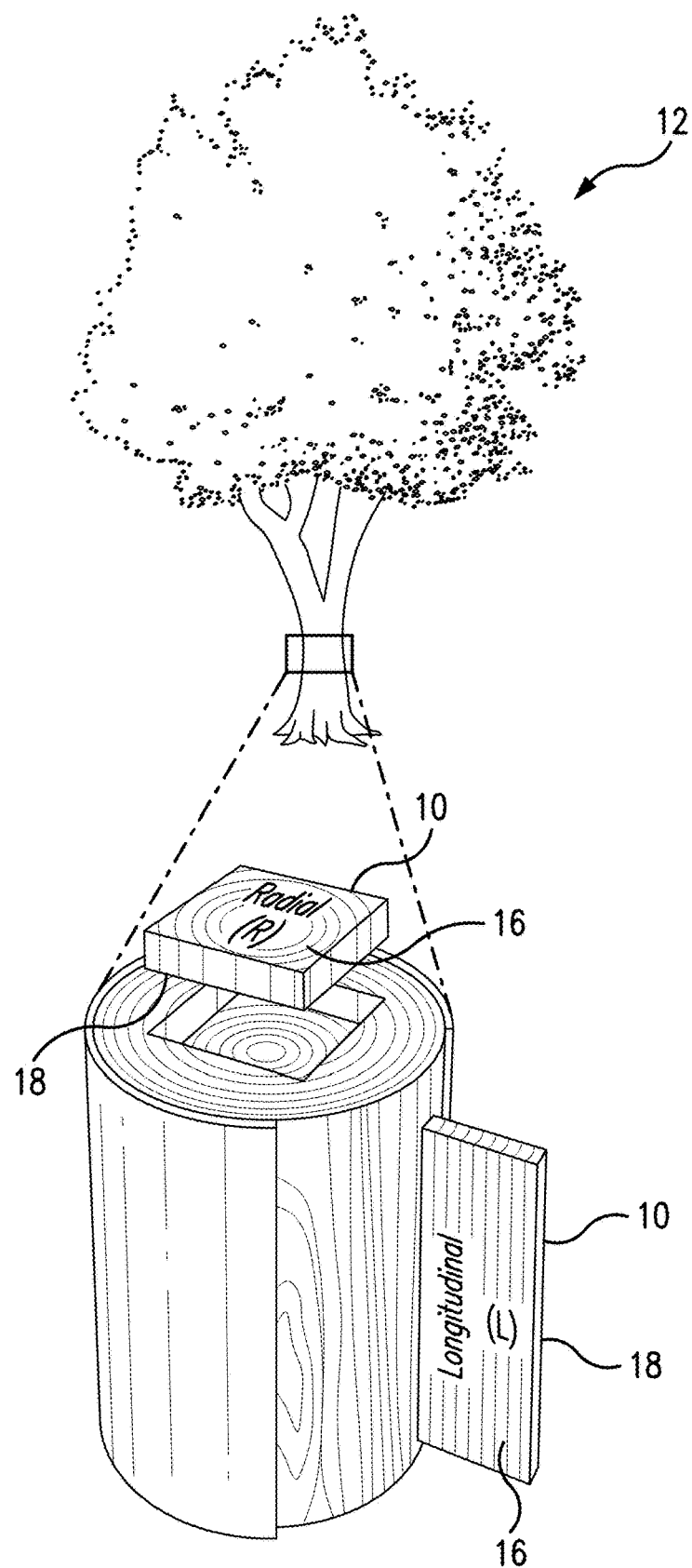
FIGS. 1A-1J illustrate schematically the manufacturing process of two types of wood blocks, where
Figure 1B:
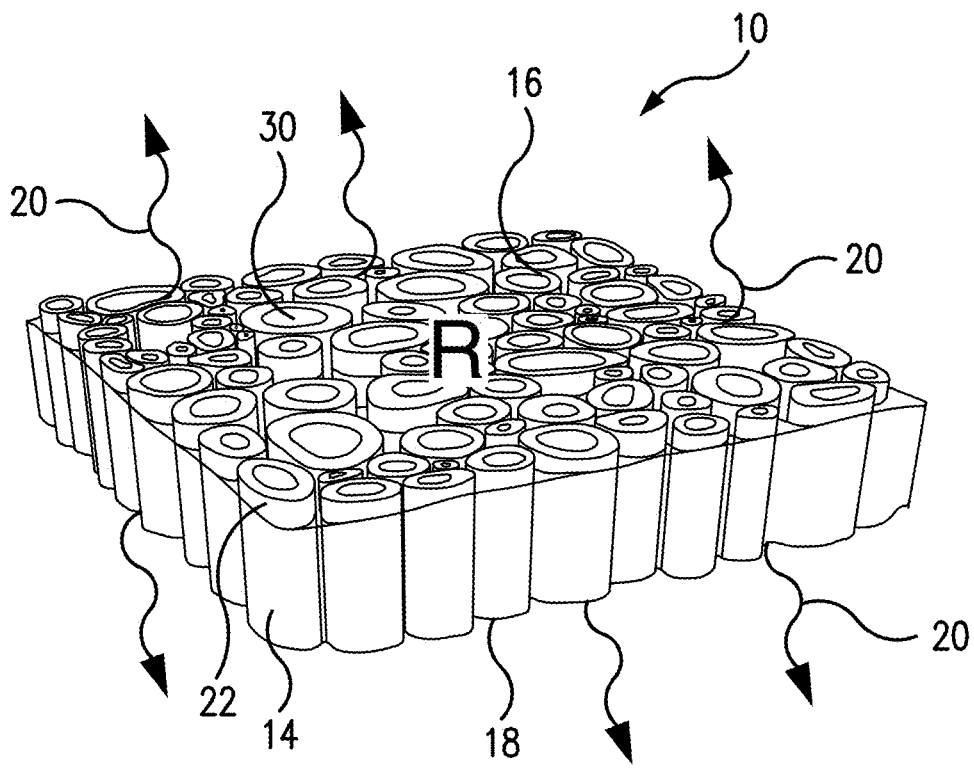
Figure 1C:
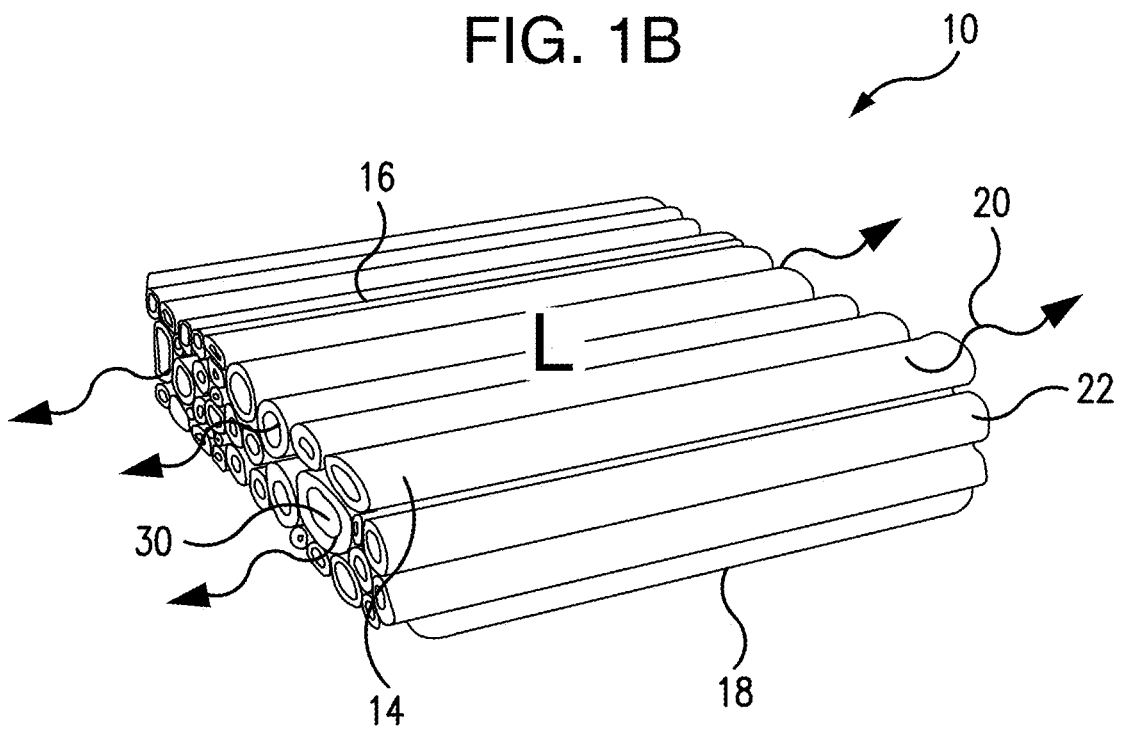
Figure 1D:
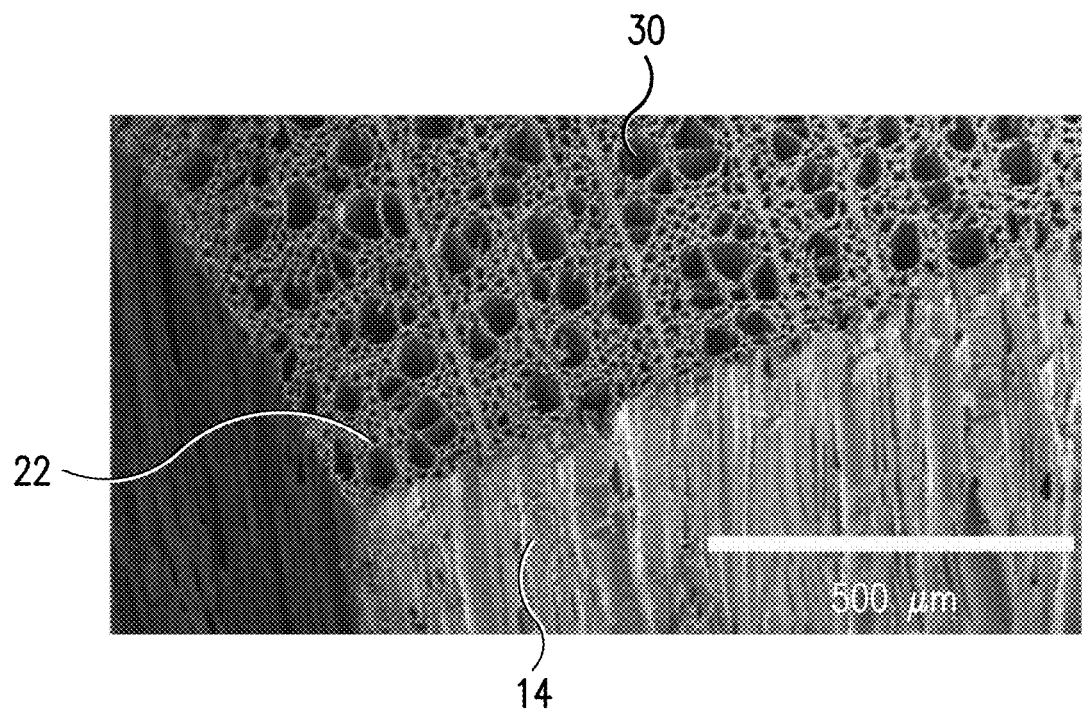
Figure 1E:
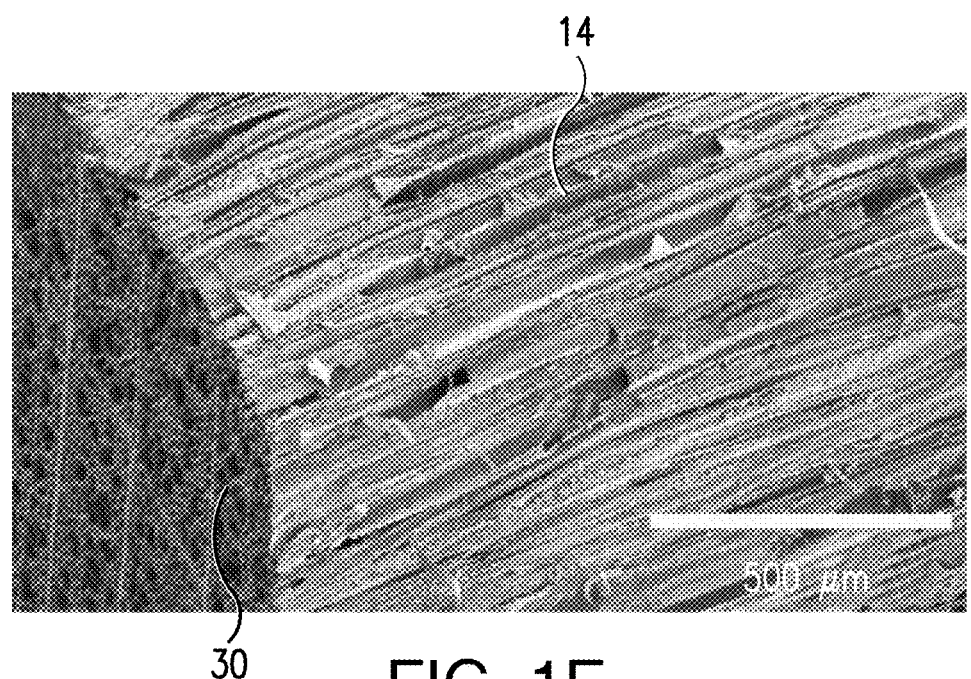
Figure 1F:
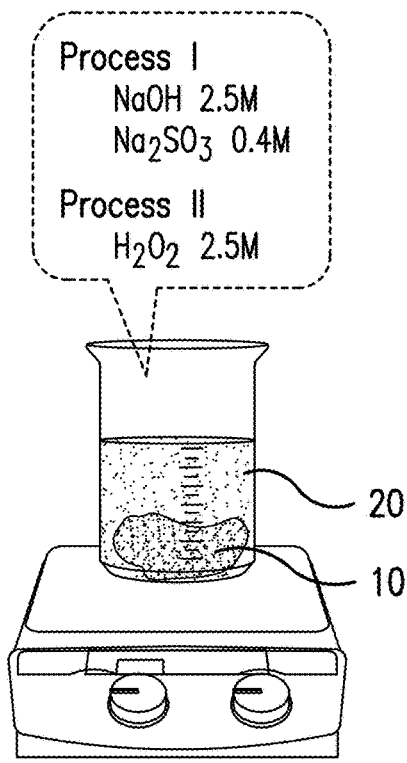
Figures 1G, 1H:
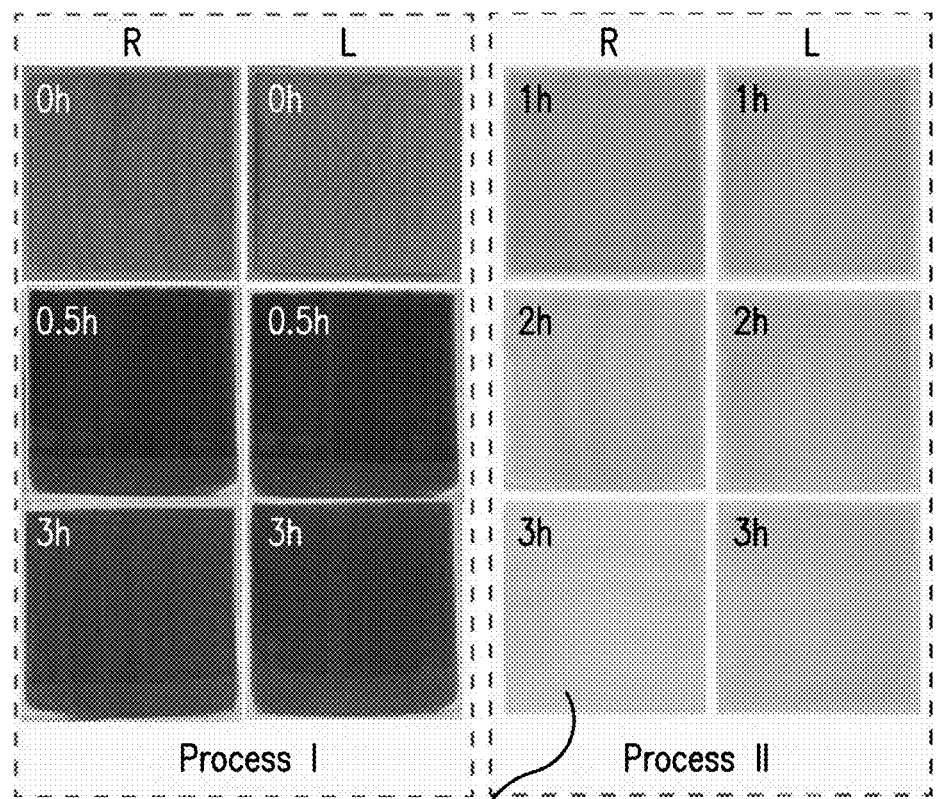
Figure 2D:
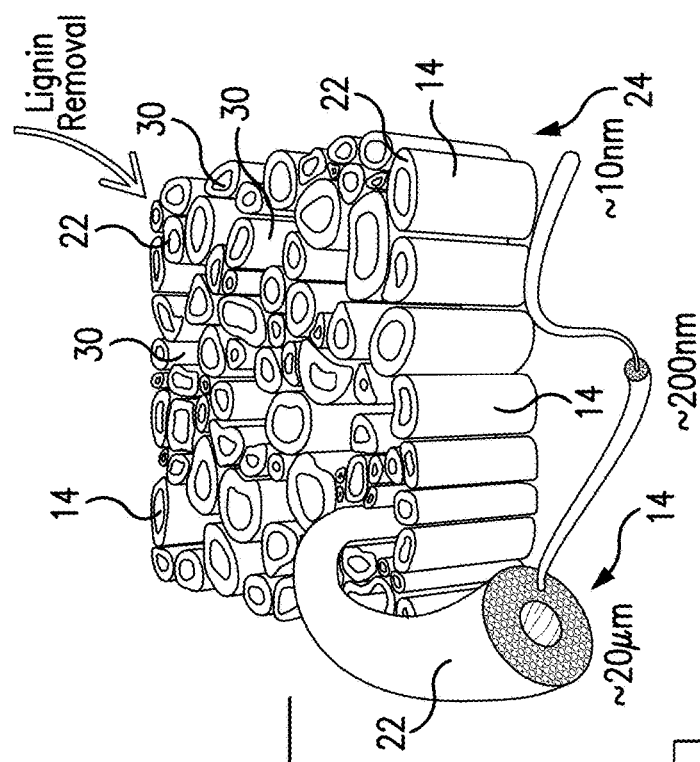
Figure 2G:
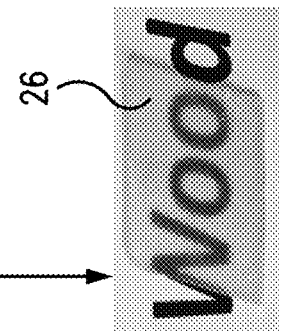
FIG. 2G shows the transparent wood composite.
Figure 2E:
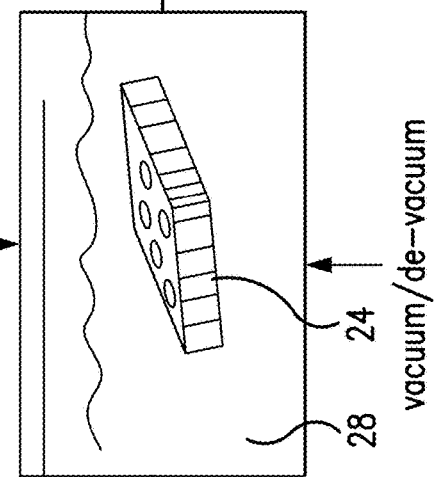

Referring to FIGS. 1A-1H and 2A-2G, the transparent wood composites were fabricated by efficient and simple process including removing the light absorptive lignin to form the lignin-devoid wood block (in the first manufacturing stage best shown in FIGS. 1F and 2D), and backfilling the nano/microsized channels in the lignin-devoid wood block with index-matching polymers (in the subsequent second manufacturing stage best shown in FIG. 2E). By filling the channels with the properly selected polymer(s), the refractive index (RI) mismatch can be greatly reduced and the light reflection can be suppressed to increase the wood sample transparency.

The well-defined internal channels in the natural wood have a low tortuosity, which permits rapid removal of the colored lignin deposited inside the internal channels. After lignin removal, the open internal channels allow fast infiltration by the polymer(s) to decrease the light scattering and increase the mechanical strength of the wood/polymer composite.

The resulting polymer infiltrated lignin-devoid wood block demonstrates optical transmittance of approximately 87±5% and a high optical haze of up to 80-100% over the broad spectrum in the visible wavelength range of 400 nm-1100 nm. The subject process preserves the well-aligned microstructure of CNF in the natural wood upon the lignin removal and the polymer infiltration which contributes to effective incident light scattering.

The pre-cut wood block may have various thicknesses to form a thick block or a thin layer, for example, the thickness of the wood transparent composite block in the subject method may range from roughly 100 μm (typical paper thickness) to a millimeter, or thicker, for example, 1.4 cm.

The subject transparent wood composites have enhanced dimensional stability in water and humid environments depending on the filling material, which may be selected from a large group of index matching materials.

When the thin layer of the subject transparent wood composite is attached to a GaAs solar cell as a light management coating, the structure demonstrates an enhanced efficiency of the solar cell by 18%.

The subject transparent wood composite also has been demonstrated as a valuable building material which is capable to efficiently harvest sunlight to provide consistent and uniform indoor lighting. The vertically aligned transparent wood fibers in natural wood exhibit an efficient visible light guiding effect with a large forward to back scattering ratio. When used as a window or a rooftop, the subject transparent wood effectively guides sunlight into the building. Unique optical properties, such as an extreme optical haze (>95%) in the broadband range and a high transmittance (>85%), lead to a uniform and comfortable indoor ambient lighting without a glare effect in buildings. The transparent wood composite also has better thermal insulation than glass with at least three times lower thermal conductivity. Greenhouse gas emission from residential and commercial sectors can mainly be attributed to the energy use of buildings which is reduced by the use of the transparent wood. The application of the subject energy efficient transparent wood building material can yield substantial energy savings with associated reductions in greenhouse gas emission. The wood based transparent composites can find a range of potential applications in the next-generation energy efficient buildings.

As shown in FIGS. 1A-1H and 2A-2G, the subject fabrication process begins with pre-cutting a wood block 10 from a natural wood 12 in a predetermined angular relationship to a direction of natural internal channels 14 extending along the trunk of the natural wood 12. The wood block 10 has two opposing planes, for example, upper and bottom cut planes 16 and 18, respectively, which may be parallel or non-parallel each to the other.

The angular relationship between the cut planes 16, 18 and the direction of the internal channels 14 may encompass any angular displacement between the direction of the internal channels 14 and the cut plane of the wood block 10. However, for the sake of clarity, as an example only, but not to limit the scope of protection of the subject invention, two angular relationships are presented in following paragraphs, including (1) cross sectional cut forming radial (R-wood) type of the wood block 10, shown in FIGS. 1A-1B, 1D, 2C-2D, and 2F, and (2) longitudinal cut forming longitudinal (L-wood) wood block 10 as shown in FIGS. 1A, 1C, and 1E. As indicated supra, other angular relationships for cutting the wood block 10 ranging between R (90°) and longitudinal direction (0 or 180°) are also contemplated in the process of fabrication of the subject transparent wood composite structure.

The channels 14 in the wood are naturally filled with lignin 20. The channels 14 have walls 22 which are made from cellulose and/or hemicellulose. The subject fabrication method contemplates the step of lignin removal, which is schematically shown in FIGS. 1F and 2D, where wood blocks are heated in water with chemicals NaOH and $Na_2SO_3$ in Process I, and bleached in solution of $H_2O_2$ in water in Process II, both of which combinably constitute the lignin removal stage to form a lignin-devoid wood sample 24.

Figure 2F:
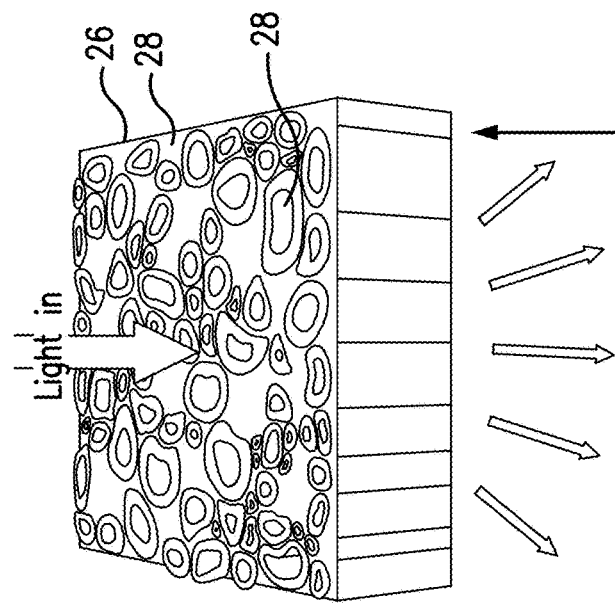
FIG. 2F shows the transparent wood block of FIG. 2D with the polymer infiltrating the natural inner channels of the wood.

As shown in FIGS. 1G-1H, during lignin removal in the Processes I and II, the brown and yellowish wood block 10 gradually becomes lighter, and finally becomes white (white wood 24) due to the light scattering and the absence of light absorption by lignin. Upon complete lignin removal, the channels in the white wood block 24 are open to permit the subsequent infiltration of the lignin-devoid sample 24 with a refractive index-matching polymer to decrease the light scattering as shown in FIG. 2F-2G, thus forming a highly transparent wood composite 26.

The subject process is applied to fabrication of R-wood, as well as L-wood, transparent composites, although with different process regimes due to the fact that in the R-wood type, the internal channels 14 are shorter and their openings 30 allow easier access by the chemicals (as shown in FIGS. 1B, 1D) than in L-wood where the longer open channels 14 extend in the direction of planes 16, 18 of the wood block 10 (as shown in FIGS. 1C and 1E). The processes of lignin removal and polymer infiltration are longer for the L-wood than for the R-wood.

The difference in the channels length in R-wood and L-wood dictates the difference in lignin-renewal and polymer-infiltration kinetics. Due to the fact that the channels lengths in the R-wood (FIGS. 1B and 1D) is much shorter than the lengths in L-wood (FIGS. 1C and 1E), the lignin removal and polymer infiltration faster in the R-wood slices.

There are a large number of straight channels 14 in a wood trunk 12 extending along the growth direction. Wood slabs 10 with dramatically different microstructures can be readily obtained by cutting in different directions, for example, as shown in FIG. 1A, R-wood has open channels 14 perpendicular to the plane(s) 16 and 18 with a depth substantially the same as the thickness of the wood. L-wood has the identical mesoporous open channels but the depth of the open channels corresponds to the length of the wood block 10. The difference in the anisotropic microstructure of R- and L-wood leads to a significant difference in lignin removal rate, where lignin can be extracted much easier in R-wood due to the open channels with a short depth (FIGS. 1B and 1D). It takes a longer time to extract lignin from L-wood (FIGS. 1C and 1E).

As shown in FIGS. 1D and 1F, which display the microstructures of R-wood and L-wood, respectively, the open channels in wood are not uniform in diameter, ranging from 10 μm to 80 μm, which leads to the difficulty in removing lignin in L-wood.

In an experiment, wood blocks 10 with a dimension of 50 mm by 50 mm and a thickness of 3 mm were used. As shown in FIG. 1F, pre-cut wood blocks 10 were soaked in boiling solution containing NaOH and $Na_2SO_3$ (Process I) to dissolve part of the lignin content. Then the wood blocks were subsequently transferred into $H_2O_2$ solution in water for bleaching, i.e., to remove the remaining lignin (Process II). The lignin removing chemical is typically prepared as described in precious paragraphs.
Other lignin removal chemicals (widely used in paper making industry) include, but not limited to $NaOH+Na_2SO_4$ (boil) ($+H_2O_2$), NaClO, $H_2O_2$, $NaClO_2$+Acetic Acid, NaOH ($+H_2O_2$), $NaOH+Na_2S$ ($+H_2O_2$), $Na_2S_2O_4+ZnS_2O_4$, $ClO_2$, $CH_3COOOH$, $H_2SO_5$, $CH_3COOOH+H_2SO_5$.

Since lignin is colored and cellulose is colorless, the color of the wood blocks indicates the amount of lignin remaining in the wood block surface. The color comparison for lignin removal in R-wood and L-wood is shown in FIGS. 1G and 1H. The color becomes lighter as lignin is being removed (identified by the duration of the process). As can be seen in FIGS. 1G-1H, the process for R-wood is much faster than that for L-wood evidenced by lighter samples of R-wood than the L-woods at the same process duration. The experimental setup, shown in FIG. 1B, can be scaled up to process a number of wood blocks at the same time for mass manufacturing.

Figure 1I:
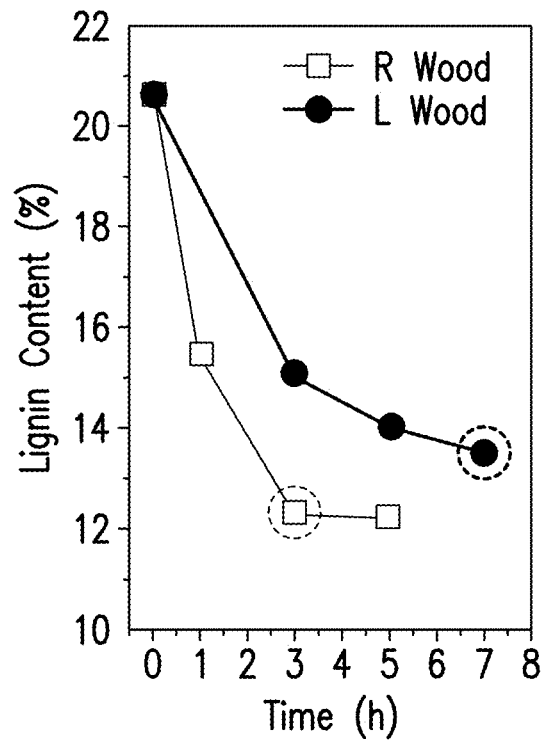
Figure 1J:
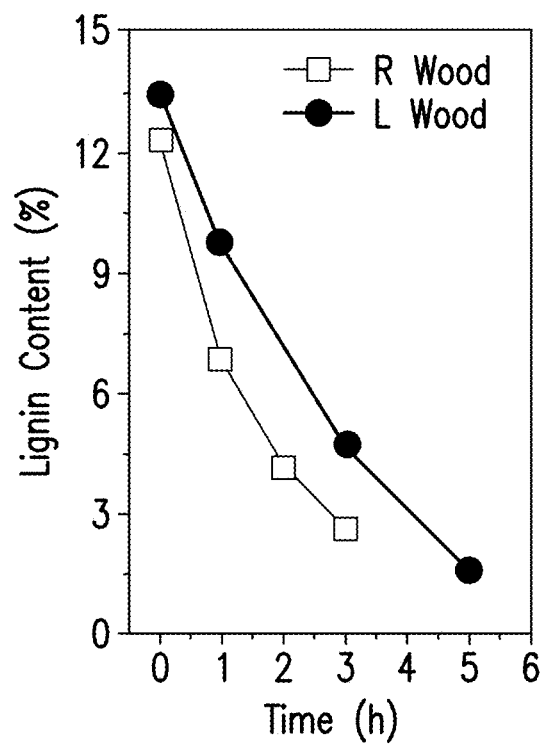

The lignin removal was quantified in both types of woods (FIGS. 1I and 1J), where the y-axis corresponds to the lignin content of the wood blocks after a certain period of time for the lignin removal processes I and II. In both types of wood (R-wood and L-wood) treated in the Process I, the lignin was removed rapidly in the first hour, where the lignin loss for R-wood is higher, up to ~25%. FIG. 1I shows clear differences in lignin removal kinetics, where the process is much faster in R-wood than in L-wood. During the Process II, the lignin in R-wood is also removed rapidly (FIG. 1J). These results agree with the fact that the channel length is much larger in L-wood than that in R-wood.

Figure 3A:
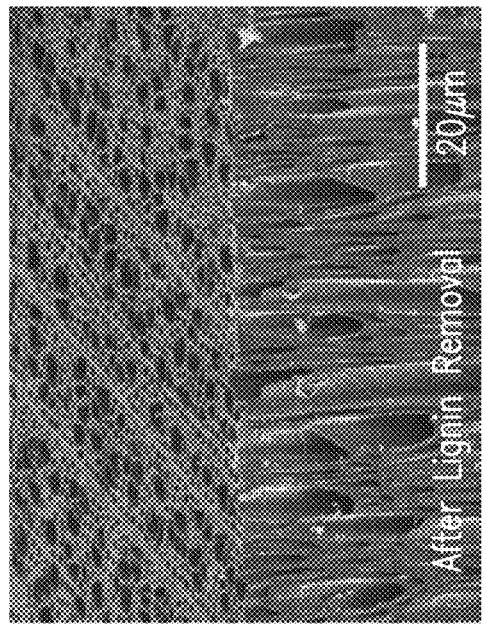
FIGS. 3A-3D show Scanned Electron Microscope (SEM) images, where
Figure 3B:
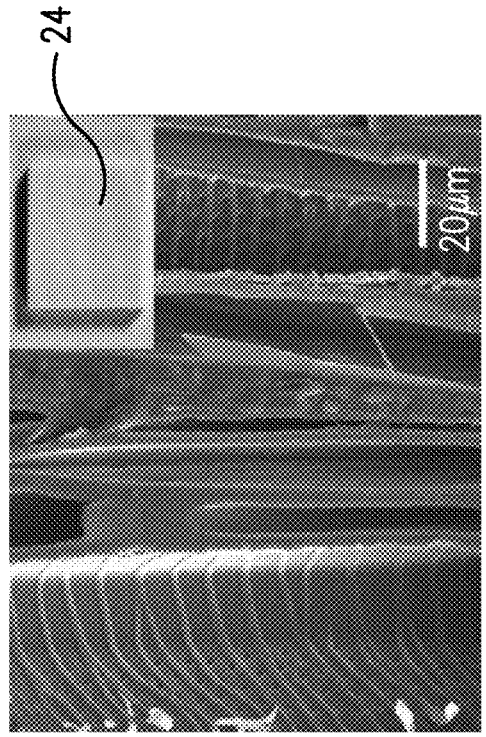
Figure 3C:
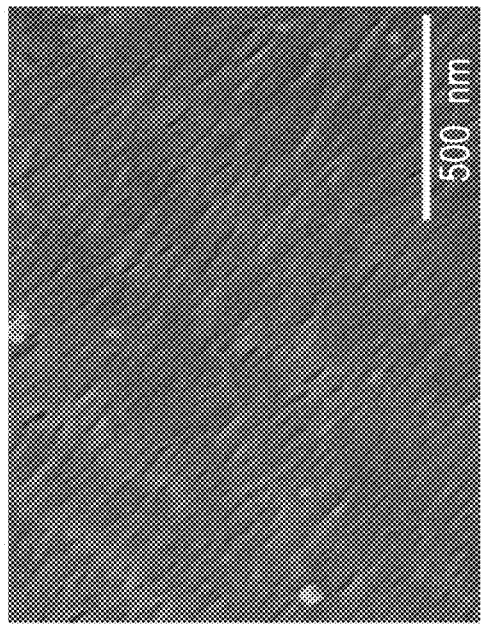

The anisotropic open channels 14 in the wood blocks not only allow fast lignin removal but also lead to fast polymer infiltration to form a transparent wood composite, especially for R-wood. FIG. 3A shows the SEM image of a wood block after most of lignin has been removed. The open channels are made of cellulose and hemicellulose. The wood block displays massive open channels and openings along the wood growth direction. Zoomed-in SEM (shown in FIG. 3B) also shows the smaller, secondary holes which enables material transport in the radial directions in the wood trunk. The inset of FIG. 3B shows the lignin-devoid white wood block 24. The microstructures with the well-defined channels are well preserved during the lignin removal process, which is important for the rapid infiltration of the polymer. Zoom-in SEM image also shows the cellulose nanofibers on the cell walls 22, which are aligned and densely packed as shown in FIG. 3C.

Subsequent to the lignin removal, a filling polymer is infiltrated into the wood microstructures under vacuum assistance, as shown in FIG. 2E. The filling polymer 28 may be a material from a group of material having a refractive index close to the refractive index of cellulose (~1.48). The filling polymer may be selected from, but not limited to, the group of materials, including:

- Thermosetting polymers, such as, for example, Polyester fiberglass, Polyurethanes polymers, Vulcanized rubber, Bakelite, Duroplast, Urea-formaldehyde, Melamine resin, Diallyl-phthalate (DAP), Polyimides and Bismaleimides, Cyanate esters or polycyanurates, Furan resins, Polyester resins, Silicone resins, Benzoxazine resins, Bis-Maleimides (BMI), Cyanate ester resins, Epoxy (Epoxide) resins, Phenolic (PF) resins, Polyester resins, Polyimides, Polyurethane (PUR) resins, Silicone Resins, Vinyl ester resins,
- Thermoplastic polymers, such as, for example, Acrylic, ABS, Nylon, PLA, Polybenzimidazole, Polycarbonate, Polyether sulfone, Polyetherether ketone, Polyetherimide, Polyethylene, Polyphenylene oxide, Polyphenylene sulfide, Polypropylene, Polystyrene, Polyvinyl chloride, Teflon,
- Cellulose derivatives, such as, for example, Cellulose acetate, Cellulose acetate butyrate, Cellulose triacetate, Methyl cellulose, Hydroxypropyl methyl cellulose, Ethyl cellulose, Hydroxyethyl cellulose, Carboxymethyl cellulose, Dissolved cellulose, Nanofibrillated cellulose, Cellulose nanocrystals,
- functional index matching materials, such as, for example, liquid crystal, pressure/temperature sensing materials, piezoelectric materials,
- as well as colorless polymer nano-glue, transparent liquid epoxy resin precursor with low viscosity, a mixture of a resin and non-blushing cycloaliphatic hardener, polyvinylpyrrolidone (PVP), Poly(methyl methacrylate) (PMMA), Poly(vinyl alcohol) (PVA), Polydimethylsiloxane (PDMS), etc. As one of numerous examples, transparent liquid epoxy resin precursor (the mixture of #300 resin and #21 non-blushing cycloaliphatic hardener) with relatively low viscosity, can be used.

Figure 3D:
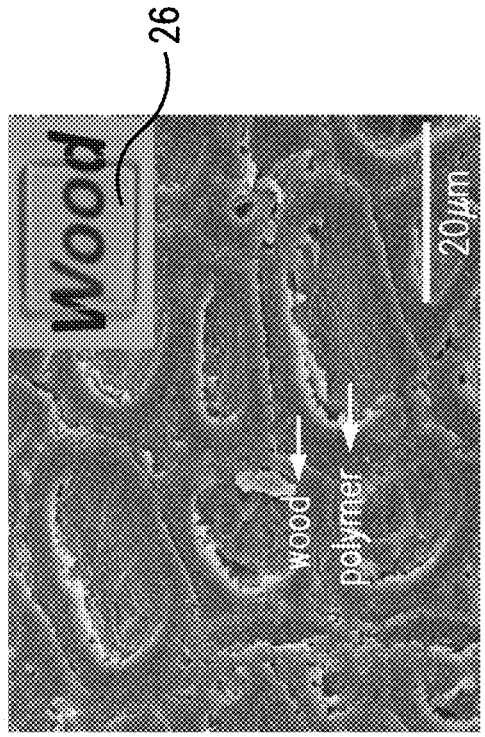

For the polymer filling stage of the subject fabrication process, the lignin-devoid white wood sample 24 is immersed in the liquid polymer 28 followed by repeated cycles of vacuum/de-vacuum processing, as schematically shown in FIG. 2E. A complete infiltration is achieved after about three vacuum/de-vacuum cycles. SEM image in FIG. 3D and schematics in FIG. 2F show that the filling polymer fully infiltrates the channels and apertures. The original cellulose walls of wood channels and the infiltrating polymer can be clearly distinguished in the SEM image in FIG. 3D. Full infiltration was confirmed in the experiments by breaking the wood-polymer composite in the middle followed by the SEM imaging. The polymer infiltration process does not destroy the frameworks of the natural wood microstructures. Strong interaction (such as the hydrogen bonding or Van Der Waals forces) between the wood cellulose and infiltrating polymer(s) preserves the framework of the wood micro-structures and prevents from being structurally altered. After the polymer infiltration, the white wood block 24 (inset in FIG. 3B) becomes optically clear, and thus, the thick (up to a centimeter) piece of wood becomes a highly transparent structural material 26 as shown in FIGS. 2F-2G and 3D.

The anisotropic structures in the two types of transparent wood (R-wood and L-wood) potentially lead to a range of anisotropic properties. The anisotropic optical properties of R-wood and L-wood have been thoroughly investigated. FIGS. 4A-4L illustrate the optical measurement for the two types (R-wood and L-wood) of transparent wood composites 26, respectively. The thickness of both R-wood and L-wood for the study was 2 millimeter for comparison purpose.

Figure 4B:
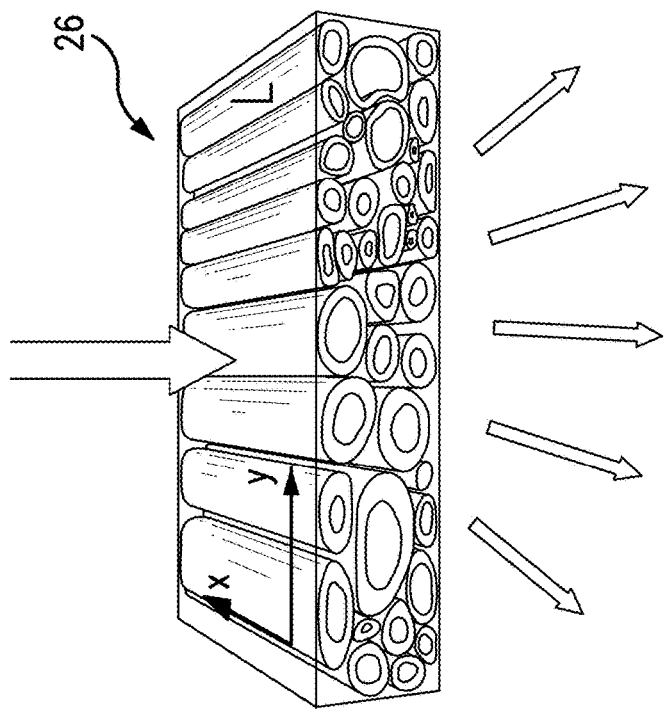
Figure 4D:
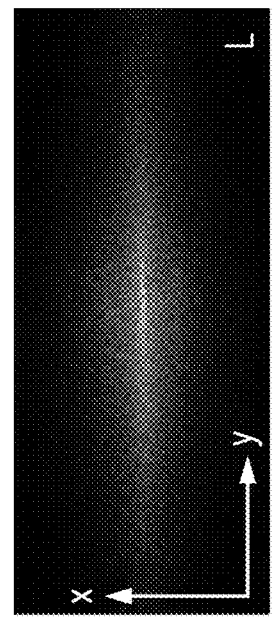
Figure 4A:
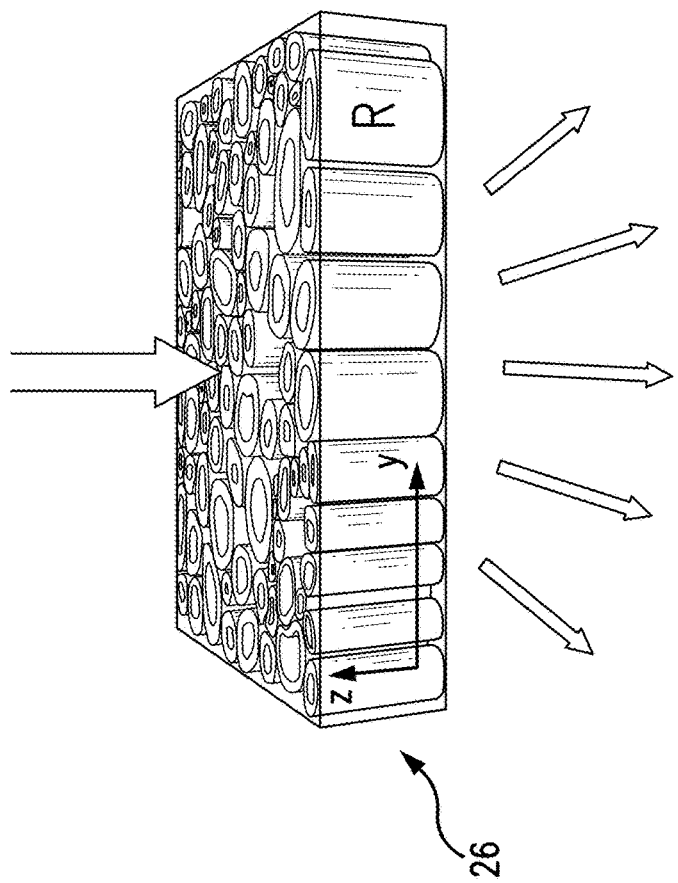
Figure 4C:
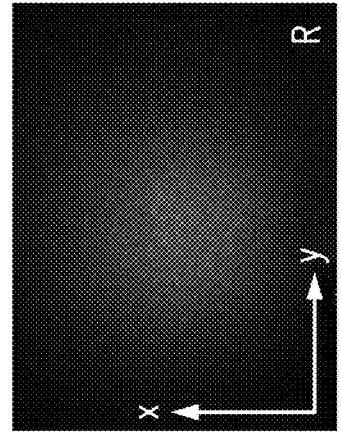

The transmittance measurement setups for transparent R-wood and transparent L-wood composite samples 26 are shown in FIGS. 4A and 4B, respectively. A 532 nm single mode laser (from Thorlabs, Inc) was used as the incoming light source for the anisotropy measurements. The laser was collimated first with a spot size around 200 µm before perpendicularly illuminating the transparent wood samples. The incoming light rapidly diverges due to the scattering in transparent wood composites. While the scattering effect is isotropic in the light propagation cross-section plane for R-wood (as shown in FIG. 4C), the light scattering in L-wood is highly anisotropic (as shown in FIG. 4D).

A photodiode power sensor S130C from Thorlabs, Inc. was used to record the scattered light intensity distribution in both the x and y direction in R-type and L-type (marked in FIGS. 4E and 4F, respectively) of the 2-dimensional plane perpendicular to the light propagation direction (z direction).

After the polymer infiltration of the R-wood, the index mismatch between the filling polymer and the cellulose fibers facilitates angle-independent scattering of the single mode Gaussian laser beam, as shown in FIG. 4E. The resulting scattered light thus exhibits a Gaussian-like distribution with similar scattering angle in both the x and y directions.

On the other hand, the wood fibers in the L-wood are aligned in the x direction, yielding a discrete index variation in y direction (as shown in FIG. 4F). A greatly traversely-expanded beam is observed in the y direction with an extremely large scattering angle, which resulted from a strong light diffraction by densely packed and aligned wood fibers. In the x direction, there is little refractive index fluctuation, and the incident light is scattered slightly, which resulted in a mild light space distribution. The strong anisotropic microstructures in L-wood lead to its intense anisotropic optical properties.

The anisotropic transparent wood composites also exhibit unique imaging effects. A grid 32 with perpendicular and parallel lines was designed to show the angle dependence in light scattering (as shown in FIGS. 4G-4J). The grid lines can be clearly seen for both the transparent R- and L-wood transparent composite samples 26 when in contact with the surface of grid lines (FIGS. 4G and 4I). However, the visual effect is different when the transparent wood composites 26 positioned 5 millimeters above the lines. For the R-wood (FIG. 4H), no lines can be observed due to the high transmittance haze. For the L-wood (FIG. 4J), in sharp contrast, the grid lines are turned to parallel lines, while the lines parallel to the open channels diminish, which is in accordance with the anisotropic haze effect shown in FIG. 4F.

Figure 4L:
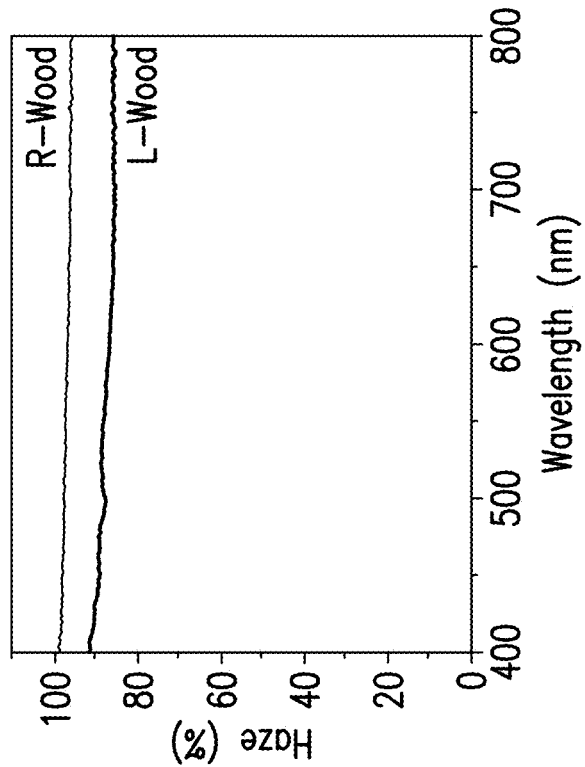
Figure 4K:
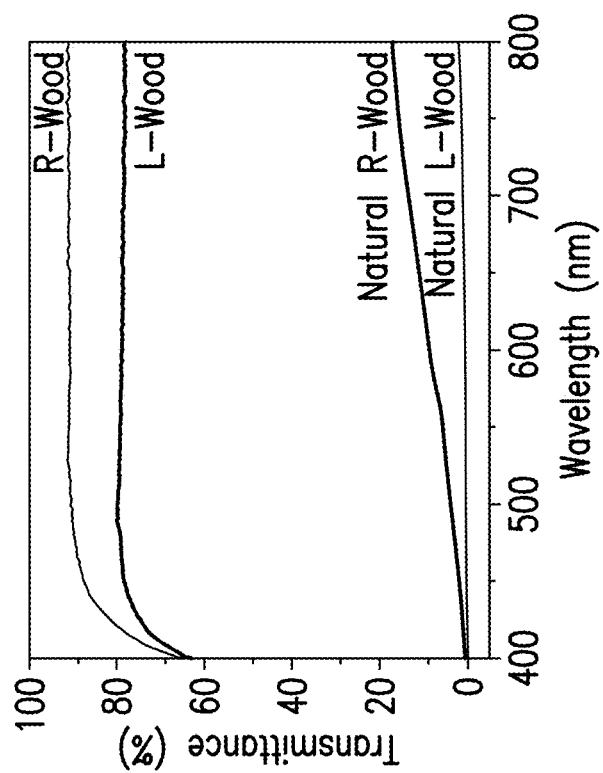

In addition to the anisotropic behavior of optical properties, the total transmittance and optical transmittance haze of the transparent wood composite has also been studied (FIGS. 4K and 4L). An integrated sphere was used to measure the optical transmittance and transmittance haze. Natural L- and R-wood show almost negligible transmittance due to the strong lignin absorption. After lignin extraction and polymer infiltration, both types of transparent wood composites show dramatically high transmittance as illustrated in FIG. 4K. The measured R-wood transmittance reaches up to 90%, higher than in the L-wood, which is due to better filling of the polymer due to the small depth for the open channels in R-wood.

Both transparent wood composite samples (R-wood and L-wood) exhibit large haze covering the entire visible wavelength ranging from 400 nm to 800 nm, while R-wood shows a generally higher value than that of L-wood (FIG. 4L).

For the transparent wood composite where the interface between the microsized cellulose and the polymer has a roughness larger than the wavelength of the incoming light, the scattering intensity is substantially independent of the wavelength. This broad range light management is referred to as Mie scattering. The high optical haze as exhibited by both types of wood can be potentially used for a wide range of optoelectronics applications where advanced light management is needed to improve the light coupling and extraction efficiency needed in solar cells and displays.

Figure 5B:
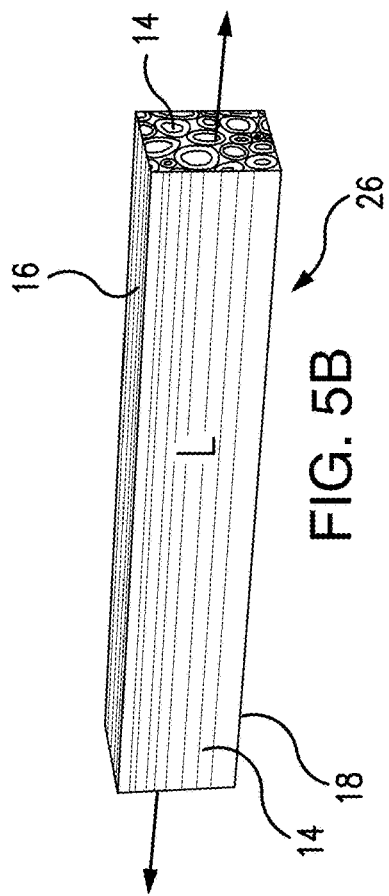
FIGS. 5A-5H are representative of comparison of structural characteristics of the R-wood and L-wood, where
Figure 5A:
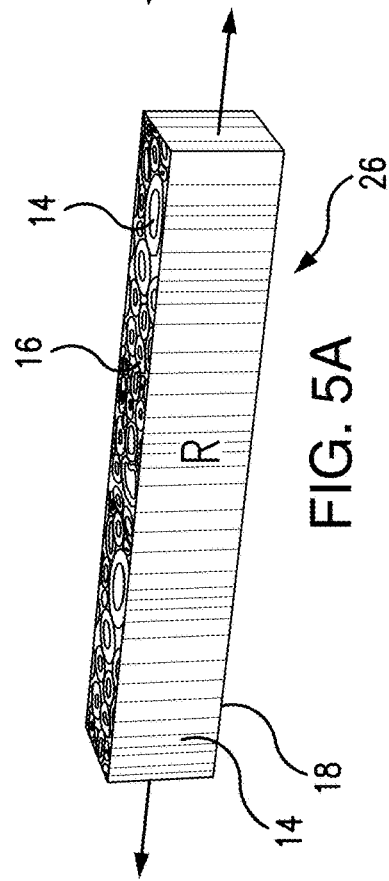

The unique mesostructures in transparent wood composites not only lead to anisotropic optical properties, but also to dramatically anisotropic mechanical properties in different directions. In order to carry out the experiment, transparent R-wood samples 26 and transparent L-wood samples 26 were fabricated having a shape shown in FIGS. 5A-5B, respectively, with dimensions of about 50 millimeters long, 10 millimeters wide and 3 millimeters thick for mechanical tests. The samples 26 are shown in FIGS. 5A-5B with channels 14 extending in crossing and longitudinal directions, respectively, between the cut planes 16, 18. A Tinius Olsen H5KT tester was used to carry out the stress-strain measurement for the samples. Natural wood samples cut into similar dimensions were also evaluated for comparison.

Figure 5D:
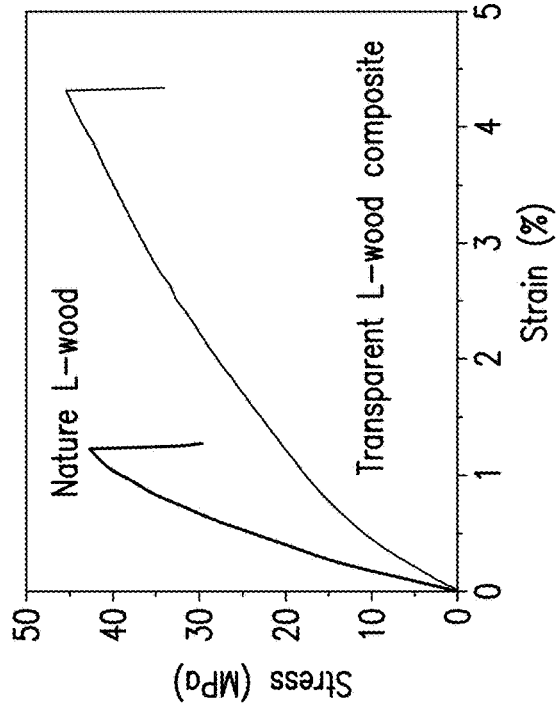
Figure 5C:
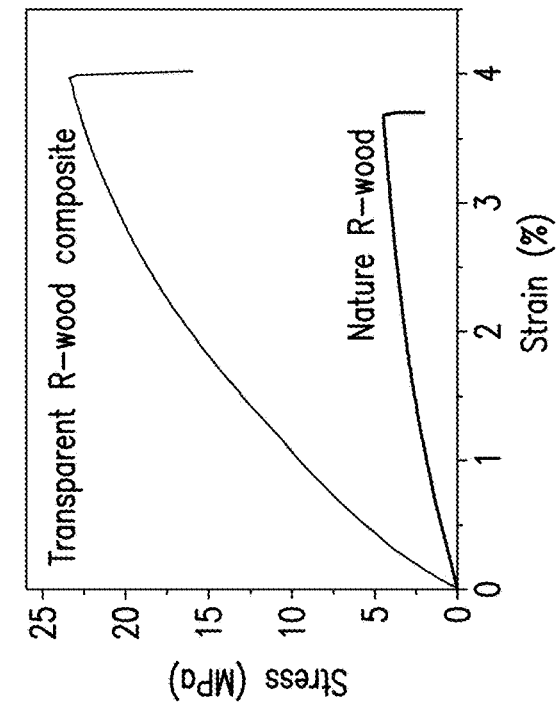

Compared with the natural R-wood, the transparent wood composite shows an improved mechanical strength, with a fracture strength up to 23.5 MPa (as presented on the diagram in FIG. 5C). For comparison, the fracture strength of the natural R-wood is only 4.5 MPa. Lignin removal and polymer filling lead to the transparent R-wood material with improved strength (FIG. 5C). An additional benefit is that the transparent wood composite possesses a ductility similar to the nature wood, i.e., ~3.7%.

The transparent L-wood has a fracture strength of about 45 MPa, around 2 times higher than that of transparent R-wood (as presented in the diagram in FIG. 5D). Transparent L-wood also has a higher ductility than the transparent R-wood. Compared with the natural L-wood, the transparent L-wood after polymer infiltration has a higher both strength and ductility.

In most materials, mechanical strength and ductility are mutually exclusive. Simultaneous increase of the strength and ductility is abnormal but highly desired for structural applications. Compared with the natural wood, the increase in both ductility and mechanical strength leads to a much higher toughness in transparent wood composites, making the subject transparent wood highly desirable for structural material applications.

Figure 5F:
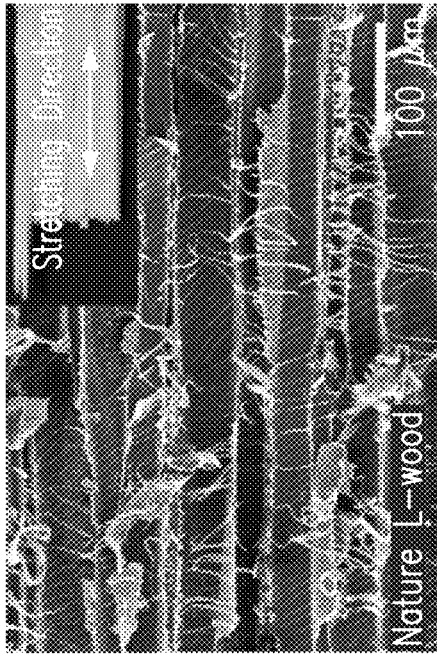

The cross section after the stress-strain test until fracture occurred has been studied by the inventors. The open channels in the natural wood are visible in the SEM images, shown in FIGS. 5E and 5F. The force applied is perpendicular relative the open channels in the R-wood, and is parallel to the channels in the L-wood.

While the SEM images show similar morphology after breaking, the macroscopic features shown in the photographs after the fracture are highly different. The cross section of the L-wood has a rough surface (inset of FIG. 5F) where the breaking happens within the channels. Meanwhile, the R-wood shows a cross section more like a brittle material (small surface, inset of FIG. 5E), due to the parallel stacking of the channels where breaks occur between the channels.

Micro-scale and macro-scale studies have been performed for the transparent wood composites to investigate failure mechanisms. In the transparent R-wood and L-wood samples, the macroscopic structures of the cross section after mechanical fracture are similar, with a smooth interface. In transparent wood composites, the filling polymers become cross-linked with the cellulose backbone after the lignin removal forming a three-dimensional network. The alignment structure observed in the SEM leads to higher mechanical strength in the transparent L-wood than in the transparent R-wood.

Figure 5H:
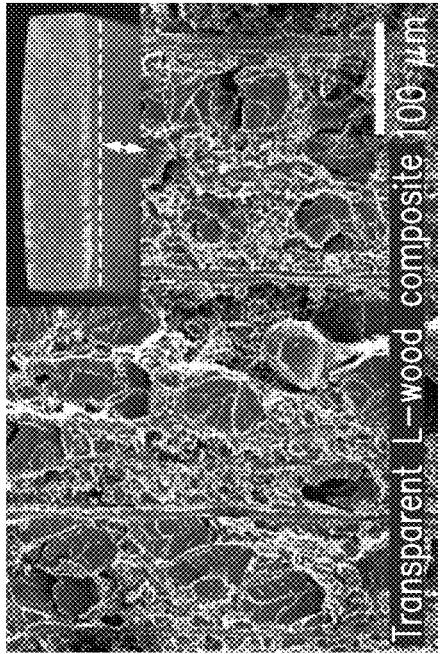
Figure 5E:
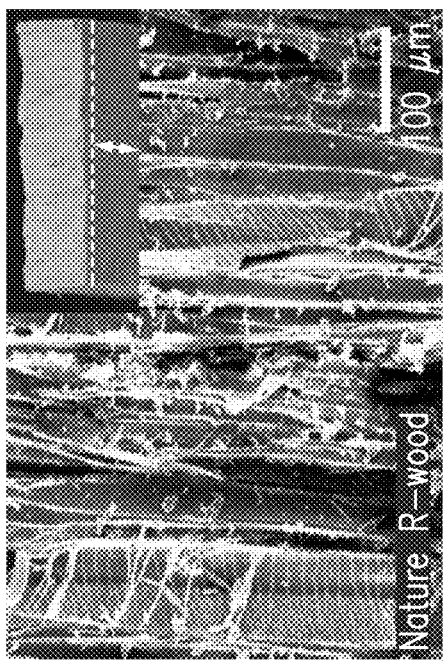
Figure 5G:
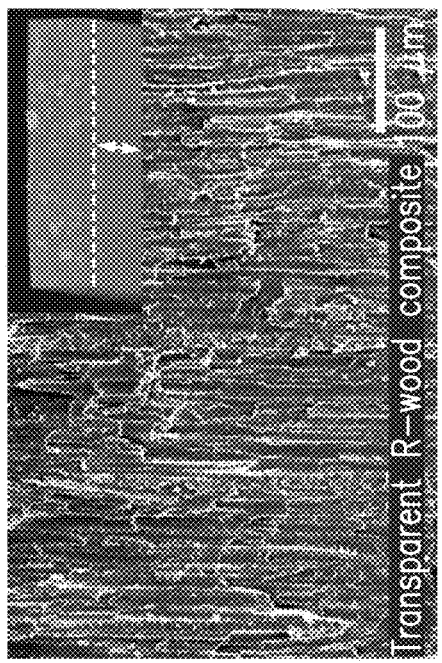

FIGS. 5G and 5H show cross section SEM of the transparent R-wood and transparent L-wood, respectively, after fracture in the stress-strain test. The inset in FIGS. 5E-5H is the photo of the samples after mechanical fracture.

Two types of anisotropic wood composites have been manufactured by taking advantage of the unique natural macrostructures in natural wood. In both transparent R-wood and L-wood composites, two stages in sequence were used to fabricate anisotropic transparent wood composites: (1) lignin removal from the open channels, and (2) polymer infiltration into the open channels. The well-defined, aligned channels largely facilitate the two processes. In both types of the transparent wood, the nature cellulose structures are well preserved, the colour of lignin is removed, and the porous structure is filled with a polymer, which leads to a high transmittance of up to 90%.

The numerous polymer-cellulose interfaces support the forward light scattering, which leads to a high optical haze at the same time. The two types of transparent wood composites (R-wood and L-wood) also display different light scattering and mechanical properties. For example, the transparent wood with open channels in the plane (L-wood) is mechanically stronger and tougher than the plane (R-wood).

Materials and Chemicals. Basswood from Walnut Hollow Company was used for experiments. The chemicals used in removing lignin contents from wood were sodium hydroxide (>98%, Sigma-Aldrich), sodium sulphite (>98%, Sigma-Aldrich) and hydrogen peroxide (30% solution, EMD Millipore Corporation). The polymer used for infiltration were Epoxy Resin (#300 resin and #21 non blushing cycloaliphatic hardener, AeroMarine Products, Inc.). Alternatively, Polyvinylpyrrolidone (PVP, average $M_w$~1,300,000, Sigma-Aldrich) was used as the filling polymer in the lignin-devoid wood. The solvents used were ethanol alcohol (190 proof, 95%, Pharmco-Aaper) and deionized (DI) water.

Lignin Removal from Wood. The lignin removal solution was prepared by dissolving NaOH and $Na_2SO_3$ in deionized (DI) water resulting in a concentration of 2.5 mol/L and 0.4 mol/L, respectively. The wood slices were immersed in the lignin removal solution and boiled for 12 hours, as shown in FIG. 1F (Process I), followed by rinsing in hot distilled water three times to remove most of the chemicals. The wood blocks were subsequently placed in the bleaching solution ($H_2O_2$, 2.5 mol/L in DI water) and boiled without stirring (Process II shown in FIG. 1F). When the yellow color of the samples disappeared, the samples were removed and rinsed with cold water. The lignin-devoid samples were then preserved in ethanol.

Polymer Infiltration. Epoxy Resin was prepared by mixing the two liquid components (#300 resin and #21 non blushing cycloaliphatic hardener) at a ratio of 2 to 1. The lignin-devoid wood samples were placed at the bottom of a dish and immersed in the liquid resin. The solution was then degassed (vacuum) under 200 Pa to remove the gas and ethanol solvent in wood as shown in FIG. 2E. In approximately 5 minutes, the vacuum was released to allow the polymer filling into the wood structure at atmosphere pressure. The process vacuum/de-vacuum was repeated for 3 times as shown in FIG. 2E. All these processes were terminated within 30 minutes to avoid the polymer solidification. Finally, the dish containing the wood sample and polymer was kept static (undisturbed) at 30° C. for 12 hours. The polymer-infiltrated wood sample was peeled from the dish after the polymer was completely solidified.

When using Polyvinylpyrrolidone (PVP), the polymer was dissolved in ethanol at a concentration of 15% by mass of polymer. After full dissolution, the lignin-devoid wood was placed at the bottom of a dish and immersed in a PVP solution. The solution depth was approximately an order of magnitude greater than the wood thickness. The solution was then degased under 200 Pa for approximately 10 minutes to ensure full infiltration. Finally, the dish was placed on a hot plate at 60° C. The polymer-infiltrated wood sample was peeled from the bottom of the dish after the solvent was completely evaporated.

Measurements and Characterizations. The morphologies of the transparent wood composite were characterized by a scanning electron microscope (SEM, Hitachi SU-70). The transmittance spectrum and haze were measured with a UV-Vis Spectrometer Lambda 35 (PerkInElmer, USA.). The lignin contents were measured by the standard methods for lignin determination (Technical Association of Pulp and Paper Industry Standard Method T 222-om-83).

About 1 g ($m_0$) of dry wood was measured and extracted with ethanol alcohol for 4 hrs, which was then treated with 15 mL of cold $H_2SO_4$ (72%) for 2 hrs with vigorous stirring at 20° C. The mixtures were transferred to a beaker and diluted to 3% by mass of $H_2SO_4$ by adding 560 mL of DI water, and boiled for 4 hrs. After cooling down, they were filtered and washed with DI water. The insoluble materials were dried and weighed ($m_1$). The lignin content was calculated as: $[m_1/m_0] \times 100\%$.

Photocurrent-voltage characteristics of solar cells were monitored with a voltage-current source meter (2400 Keithley) illuminated by an Orel Solar Simulator (AM 1.5, 100 mW/cm$^{-2}$) with a scan rate of 10 mV/s.

A 532 nm single mode laser DJ532-10 (Thorlabs Inc.) was used as the incoming light source with stabilized output power. The laser was collimated first with a spot size around 200 µm before perpendicularly illuminating the samples. The Gaussian beam quickly diverges after propagating through the transparent wood composite. In order to map the scattering distribution, a photodiode power sensor S130C from Thorlabs was used to record the scattered light distribution in the 2-dimensional plane perpendicular to the light propagation direction. A pinhole with a constant diameter of 5 mm was placed in front of the photo diode to record the light power at various angles along x and y directions. The mechanical properties were structured using a Tinius Olsen HSKT testing machine. The wood was selected without joints or fasteners with a dimension of about 50 mm×10 mm×3 mm.

Anisotropic channels are found within the trunks of most trees. These mesoporous channels have a diameter of 25 µm to 50 µm and allow the extraction of lignin along the channel direction. Dry basswood slabs of typical thickness in the range of 100 µm to 14 mm were obtained by cutting perpendicular to the tree growth direction. The open channels in the thin sections enable the fast removal of lignin from the wood slab.

Figure 6A:
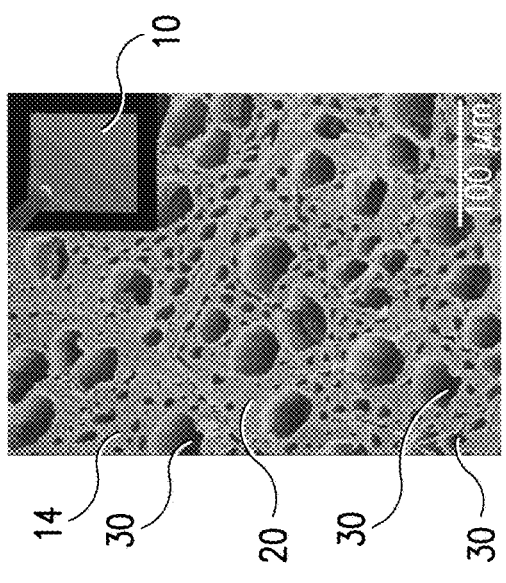
FIGS. 6A-6F show scanning electron microscope (SEM) images of the wood transformation during the fabrication process, where

Generally, basswood contains 18% to 21% lignin and 79% to 82% hemicellulose and cellulose by mass. The SEM image of the sample 10 before lignin 20 removal is shown in FIG. 6A. Lignin 20 was extracted from the channels 14 and apertures 30 by the chemical processes of NaOH treatment followed by $H_2O_2$ bleaching. During removal of the colored lignin, the wood slab 10 gradually lost its color (as the lignin was being removed), and became visibly whiter due to the large light reflection at the interfaces. During the lignin removal process, it was observed that the brown color of the natural wood diminished gradually and finally changed to snow white (the inset 24 shown in FIG. 6B).

Figure 6B:
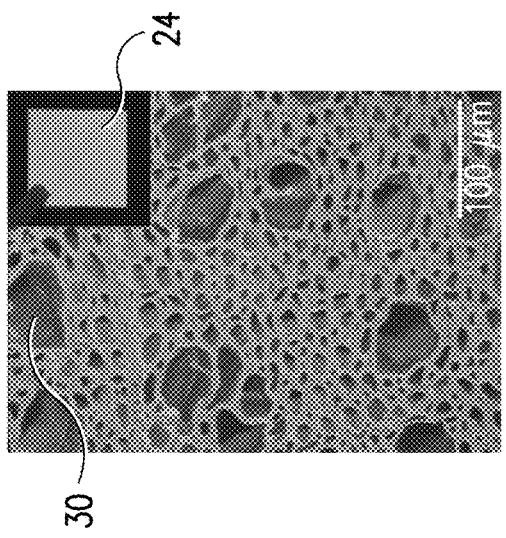
Figure 6C:
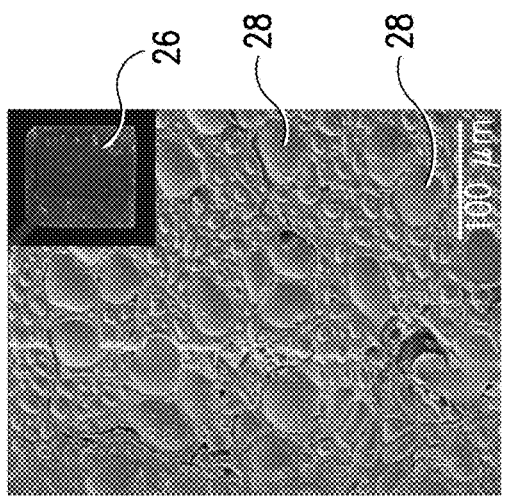
Figure 6D:
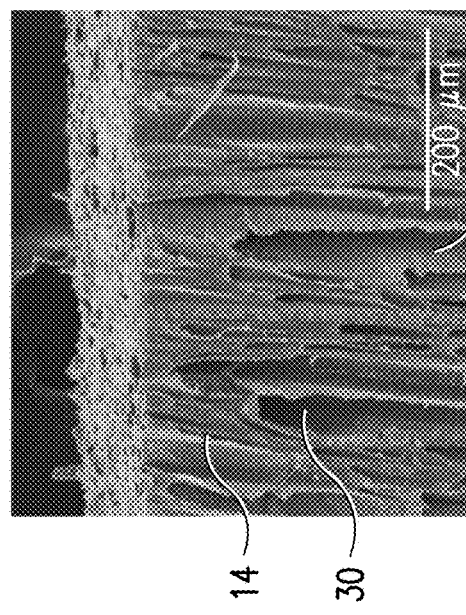
Figure 6E:
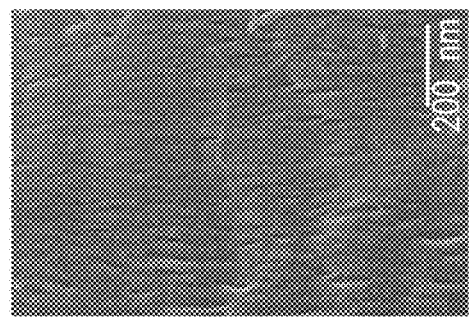
Figure 6F:
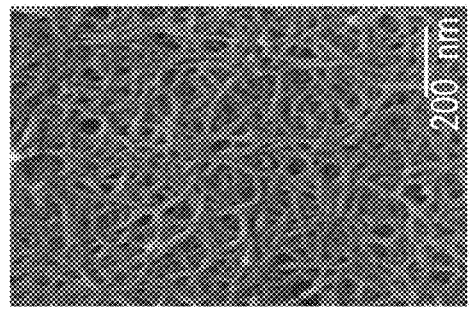

By controlling the speed and duration of the lignin removal process, the lignin was removed almost entirely while simultaneously preserving the microstructure of the wood, as shown in FIGS. 6B and 6D. It is noteworthy that well-aligned microstructure in the wood block was successfully preserved after the lignin removal process (FIGS. 6E and 6F).

The open vertical channels after lignin removal also support the rapid infiltration of filling materials to achieve other functionalities. Index-matching polymers 28 were used to fill the lignin-devoid channels 14 and to reduce light scattering to attain high optical transmittance.

As an example, Polyvinylpyrrolidone (PVP) 28 was selected (from a number of different refractive index matching polymers) as the filling material because of its excellent transparency, relatively low viscosity in ethanol and good wettability on cellulose. These characteristics of PVP enabled it to fully permeate the micro-scale apertures 30 in wood. PVP is environmentally friendly and biodegradable, similar to wood nanofibers.

FIG. 6C shows a scanning electron microscope (SEM) image of the wood block after PVP polymer filling, where all the apertures 30 and channels 14 between the cellulose walls have been completely filled with polymer 28. The resulting transparent wood 26 is shown as an inset in FIG. 6C with well-preserved wood textures.

In addition to functioning as an index matching material with the remaining cellulose, the polymer infiltration into the wood microstructures also mechanically glues the wood cellulose nanofibers (CNF) together.

The subject method for fabricating transparent wood composites allows the original alignment of CNF to be preserved.

FIG. 6D illustrates the cell walls of the channels 14 and apertures 30. The CNF are clearly aligned without being affected (as shown in FIG. 6E). These aligned CNF lead to enhanced mechanical properties. The close packing of the aligned CNF complicates their characterization by SEM. The snow-white wood 24 has been further disintegrated for a longer period of time to achieve satisfactory SEM with a higher contrast. Upon further processing, the aligned fibers were broken down into a randomly distributed network as is depicted in FIG. 6F.

After the lignin is removed, wood exhibits a bright white color with a low overall transparency, which is due to the large refractive index difference between cellulose and air. PVP is a highly transparent polymer with a refractive index of about 1.53 at wavelength λ=550 nm, a value close to the refractive index of ~1.48 for cellulose. The reflection of light normal to the interface is 0.04% for cellulose and PVP (RI=1.48 and RI=1.53, respectively), compared to 4.4% for air and cellulose (RI=1.00 and RI=1.48, respectively). Consequently, after PVP infiltration, light reflection and scattering along the wood microchannels have been greatly suppressed but not completely eliminated. Additionally, high transparency is attained along with high haze. The optical properties can be more finely tuned with polymers of different refractive indexes.

Figure 7C:
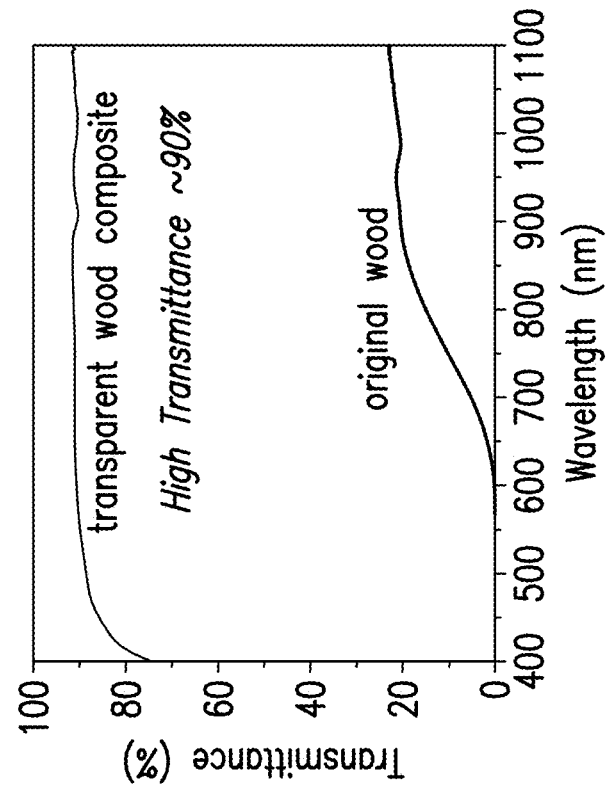
FIGS. 7A-7C show the comparison of transmittance between the fabricated transparent wood composite and natural wood, where
Figure 7A:
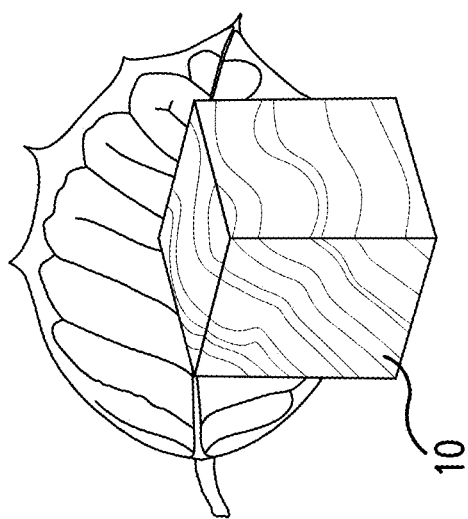
Figure 7B:
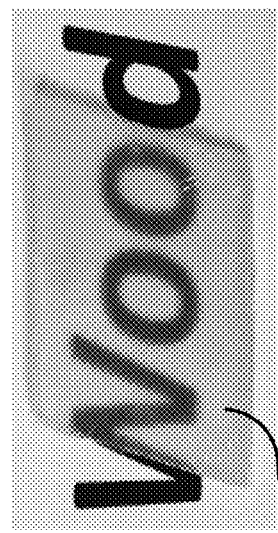

FIG. 7A shows a natural wood block 10 measuring 30 mm×22 mm×1 mm. The wood composite 26 shown in FIG. 7B is highly transparent and the text underneath is clearly visible. The diagram of measured transmittances of the transparent wood and the original wood are shown in FIG. 7C. The natural wood 10 in FIG. 7A shows zero transmittance at wavelengths from 400 nm to 600 nm, which is mainly due to the large light absorption of the lignin matrix. The maximum transmittance does not exceed 25% over the measured range of wavelengths. In sharp contrast, the transparent wood 26 (FIG. 7B) exhibits a transmittance of about 90±5% in air from visible (λ=400 nm) to near infrared (λ=1100 nm). The overall transparency for a 1 mm thick wood transparent composite is comparable to transparent glass, plastic and cellulose-based nanopaper. In experiments, high transparency has also been demonstrated for wood samples as thick as 14 mm and larger. These results clearly confirm the effectiveness of the subject process containing the step of lignin removal followed by the step of polymer infiltration for the production of transparent wood composites.

Figure 8A:
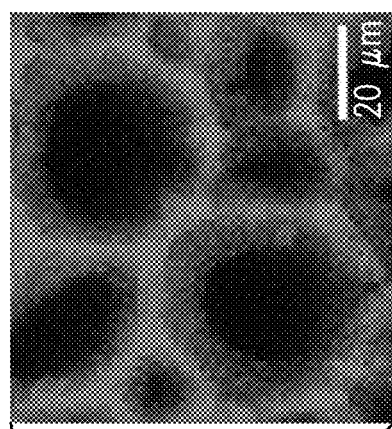
FIG. 8A is a diagram representative of the transmittance characteristic of wood slabs with different percentage of lignin removed.
Figure 8D:
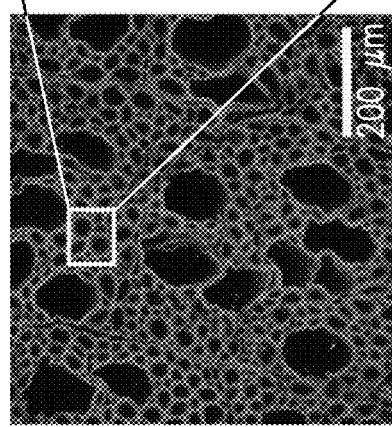
FIGS. 8D-8G are fluorescent images of the wood with different weight percentage of lignin removal level.

In order to quantify the influence of lignin content on the optical properties of wood, absorption measurements were performed at various stages during the processing. FIG. 8A shows the transmittance of wood with different amounts of lignin. Overall, the absorption edges shift to longer wavelengths with increasing lignin content. For untreated (curve A) and 33% (line B) lignin removal (LR) samples, the absorption range covers the entire visible light spectrum (% LR represents lignin removal by mass). In comparison, the sample with 50% LR (curve C) and with complete lignin removal (curve D), exhibit a greatly enhanced transmittance and minimized light absorption in the entire visible light range.

Figure 8B:
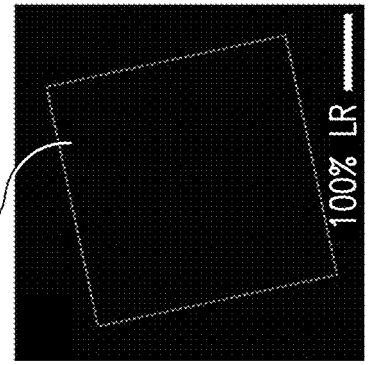
FIGS. 8B and 8C are fluorescent images of the wood on different scale.
Figure 8C:
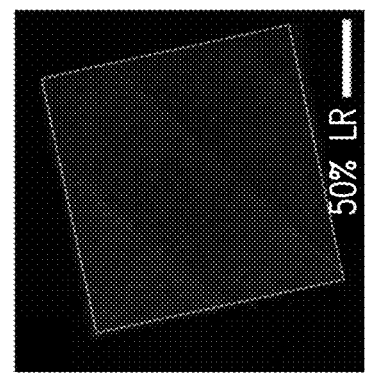
Figure 8E:
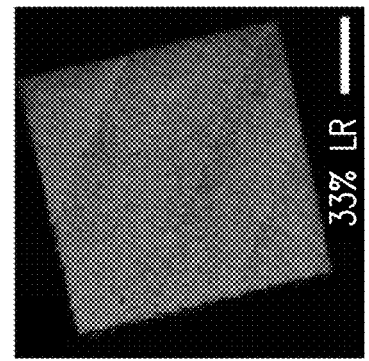
Figure 8F:
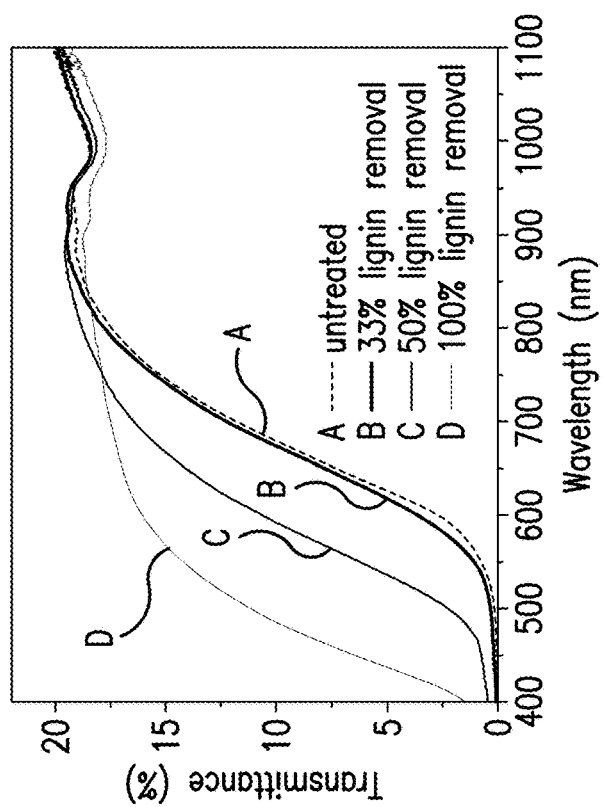
Figure 8G:
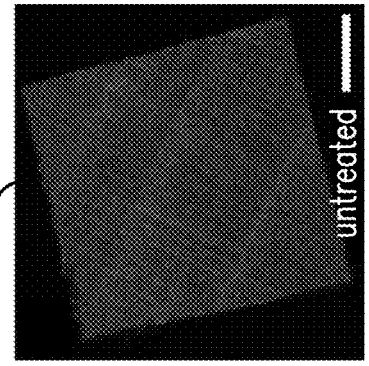

In addition, lignin exhibits fluorescence emission since it contains chromophores. Photoluminescence techniques were used to verify the lignin content in the wood samples with varying amounts of lignin. Fluorescence images of wood with different weight percentage of lignin removal (LR) level are shown in FIGS. 8D-8G, beginning from wood sample 10 (in FIG. 8D) to lignin-devoid wood sample 24 (in FIG. 8G). In general, they are in agreement with the results presented in the TAPPI standard lignin measurement method which uses luminescence to reveal the presence of lignin. It is seen that the fluorescence intensity for original wood is weaker than the 33% LR sample. This unusual behavior is caused by the self-quenching of the fluorophores. This often happens when the local fluorophore concentration exceeds the quenching concentration. The 3D fluorescence measurements (shown in FIGS. 8B-8C) show clear morphology of the wood's microstructure.

In addition to the high diffusive transmittance, the transparent wood composites exhibit high transmittance haze. Light scattering by the transparent wood composite is shown in FIG. 9A. As shown in FIG. 9B, the measured haze is around 80±5% over the wavelength range from 400 nm to 1100 nm. This is a very unique property compared to transparent glass or plastic materials with haze less than 1%. The transparent wood composite haze is also much higher than that of the ultrahigh haze nanopaper, which exhibits a haze value of approximately 60%. The high haze in transparent wood composites originates from the unique microstructure of wood.

Returning to FIGS. 6B and 6D, cellulose microchannels are the predominant structural component of wood. Each microchannel is composed of microfiber units that can be further processed into nanofibers. There are two reasons for the measured high haze. First, the wood fibers and channels often have micro-curvatures with bumps, microstripes and microcavities (FIG. 6D), causing them to function as light reflection/scattering centers. Second, the microfibers and microchannels can guide the incident light along the axial direction for efficient forward scattering.

The utility of transparent wood composites was demonstrated when used as a substrate for a GaAs solar cell 40 shown in FIG. 9C. In an effort to improve the overall conversion efficiency of solar cells, light management plays an important role. The subject transparent wood composites, with their high transmittance and high haze serve as efficient light management coatings or substrates for optoelectronic devices, such as photodetectors and solar cells.

The transparent wood 26 used for the solar cell 40 had a transmittance of around 90% and a haze of about 80% over a broad wavelength range. A drop of ethanol was deposited on the surface of the existing solar cell 40. Then the transparent wood was placed on top of the cell to form contiguous contact with the active layer 42. The sandwich structure was allowed to dry at room temperature until the wood was firmly attached to the surface of the bare GaAs solar cell.

The measured current density-voltage (J-V) characteristics of the solar cell are shown in FIG. 9D. The solar cell's electronic properties, including short circuit density ($J_{SC}$), open circuit voltage ($V_{OC}$), fill factor (FF, the ratio of the maximum output power solar the product of $V_{OC}$ and $J_{SC}$) and the overall conversion efficiency, which are extracted from the J-V curves, are presented in Table I which reflects the comparison of electrical properties of GaAs solar cell before and after the attachment of a transparent wood composite substrate.

TABLE I

|  | Voc [V] | Jsc [mA · cm$^{-2}$] | FF [%] | Efficiency [%] |
| --- | --- | --- | --- | --- |
| Bare GaAs cell | 0.952 | 17.10 | 75.1 | 12.21 |
| GaAs cell with transparent wood | 0.968 | 19.78 | 76.0 | 14.41 |
| Enhancement [%] | 0.63 | 15.67 | 1.20 | 18.02 |

An enhancement of 15.67±3% in short circuit density and a corresponding 18.02±3% boost in overall conversion efficiency have been observed under a one sun illumination. This is mainly due to a combination of a forward scattering effect and an index matching effect between air and GaAs after attachment of the transparent wood 26 to the top surface of GaAs solar cell in optical coupling with the active layer 42.

With just a PVP coating (no wood) where the interfacial refractive index mismatch has been suppressed, the Jsc enhancement is 10.1±3%, less than that of the transparent wood coating. A slight enhancement in fill factor has also been observed, which serves as an indicator that the dark saturation current has not been degraded. The transparent wood substrate significantly improves the performance of a bare GaAs solar cell as a light management layer, similar to the effects observed with transparent paper. The high transmittance allows light to reach the surface of GaAs solar cell with less loss. The normal incident light becomes diffusive when it reaches the solar cell's top surface due to the high haze. This phenomenon results in increasing the travelling path of photons in the solar cell and improves the possibility of a photon being captured within the cell's active region. Additionally, the decreased refractive index mismatch between GaAs and air after wood coverage allows light reflection to be suppressed leading to an increased light flux into the solar cell.

The application of the transparent wood has also been demonstrated as an energy efficient light harvesting building material with the following advantages. First, the subject transparent wood can efficiently harvest sunlight with a broadband transmittance of >85%. Due to the extremely high haze (≈95%) of transparent wood, the indoor illumination can be maintained substantially uniform and consistent. Second, the transparent wood exhibits a directional forward scattering effect, which can be used to effectively guide sunlight into the building. Third, wood cells present large phonon resistance with multiple boundaries.

The thermal conductivity along and across the wood channels was measured to be as low as 0.32 and 0.15 W m$^{-1}$K$^{-1}$, respectively. When used as a transparent building material, the wood composite can provide improved thermal insulation with respect to standard glass and in reducing air conditioning usage.

Figure 10B:
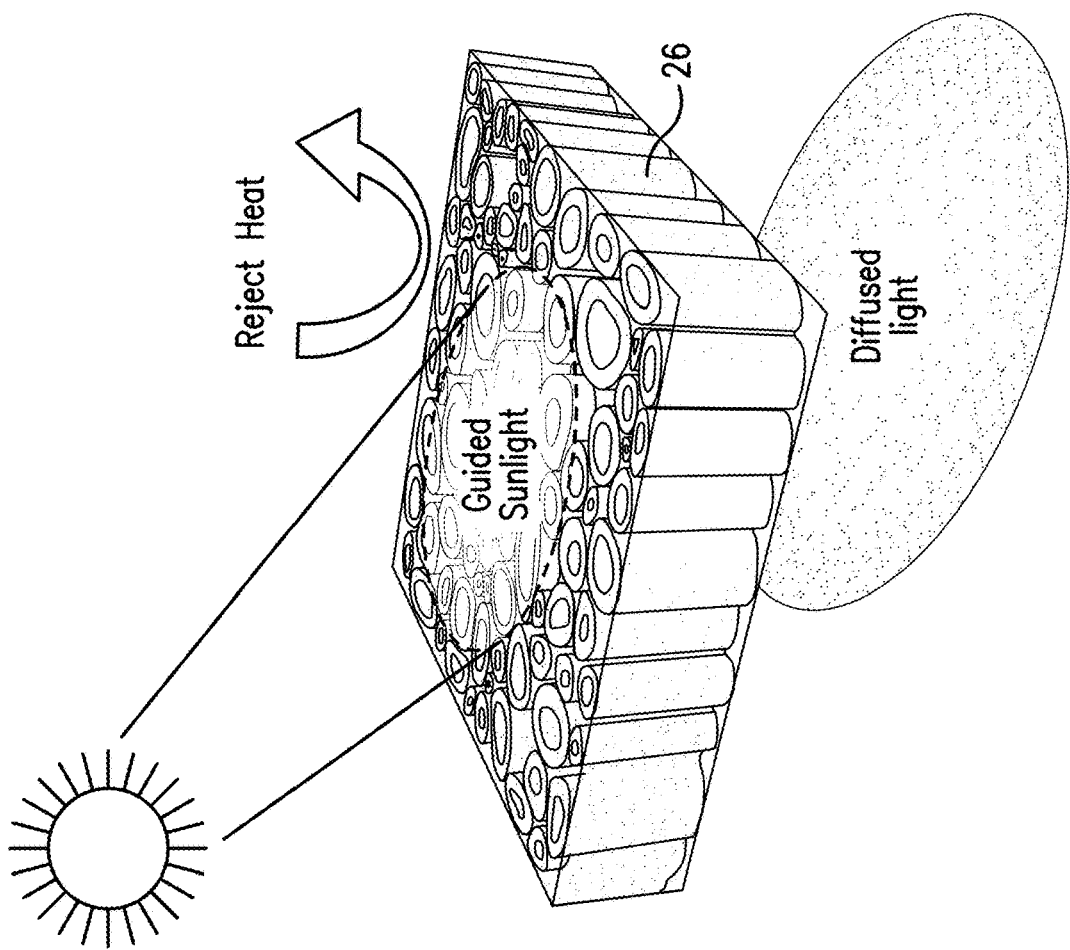
FIGS. 10A-10B show schematically an edifice with a transparent wood roof top (FIG. 10A) and a building material (FIG. 10B) made from the subject transparent wood composite which scatters the transmitted light in the forward direction to create substantially uniform lighting and is capable of reducing the conductive heat flow to maintain a substantially constant internal temperature.
Figure 10A:
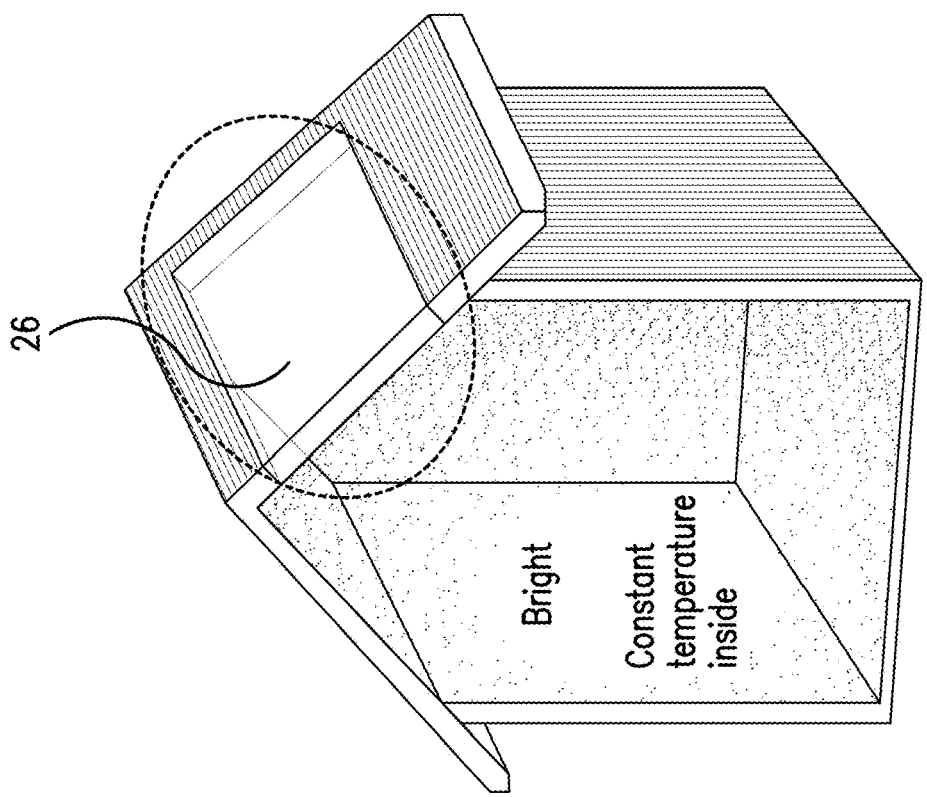

Furthermore, the subject transparent wood shows high impact absorption capability. When subjected to a sudden impact, the microchannels with infiltrated polymer absorb and disperse the energy thus helping to keep the wood from shattering. FIG. 10A illustrates the usage of transparent wood 26 as a sunlight harvesting rooftop. As shown in FIG. 10B, the transmitted light intensity distribution is insensitive to the direction of the sun, keeping the indoor light consistent throughout the day. The conductive heat flow can also be reduced with a more consistent indoor temperature. The transparent wood used as a window or rooftop material would pay for itself by providing cost savings in lighting and air conditioning energy indoors usage.

FIG. 11A is a scanning electron microscopy (SEM) image of a basswood block where the wood cells (channels) are naturally aligned along the direction of growth.

There are many suitable choices for infiltration polymers as long as the refractive index is close to 1.5 and the material has a low viscosity. With the small refractive index mismatch between the cellulose and the epoxy, light can propagate along the growth direction while the wood cells (channels) function as lossy waveguides with a diameter ranging from tens to hundreds of micrometers depending on the species of natural wood.

In order to show the light propagation in transparent wood 26, the DJ532-10 (Thorlabs, Inc.), 532 nm green single mode laser was used as the incoming light source with a spot size of 200 μm. The beam is incident from the right hand side with a 45° input angle and is indicated by the arrow in FIG. 11A. A wood block with a large thickness of 1.4 cm was used so that the propagation of the beam inside the wood block can be clearly observed.

As can be seen in the top view of the wood composite, FIG. 11B, the beam quickly diverges after reaching the top surface of the wood and then propagates along the wood channel direction. The bright laser light is well directed, indicating an efficient guiding effect. The light confinement inside the wood is mainly determined by the wood channel alignment direction instead of the incident light angle.

The densely packed and vertically aligned channels of the transparent wood 26 function as cylindrical broadband waveguides with high propagation scattering losses. This unique light management capability of the transparent wood cells results in a macroscopic light propagation effect with a large haziness. The optical properties including haze, forward transmittance, and backward reflection are summarized in FIG. 11C. The results show that the transparent wood exhibits a high transmittance around 90% and a simultaneously high optical haze around 95%. By taking an averaging 90% transmittance and ≈10% reflection within the wavelength range from 500 to 1100 nm, a directional forward to back scattering ratio as high as 9 was obtained.

For comparison, nanostructures including nanocones and nanospheres are often used in order to achieve directional scattering under the light management schemes using Mie scattering. However, the spectral response is usually sensitive to wavelength and the forward to back scattering ratio is often less than that exhibited by transparent wood cells. While exhibiting a high transmittance, the haze of the transparent wood can exceed 95% which is likely due to the scattering of the vertically propagating light by microstructural roughness.

The overall transparency for the transparent wood composite is comparable to standard glass, plastic, and cellulose-based nanopaper confirming the effectiveness of the herein developed procedure for transparent wood composites.

FIG. 11D shows a schematic of the single mode laser at a tilted angle incident on a transparent wood sample 26 with the transmitted light pattern captured on the screen. As shown in FIG. 11E, the beam intensity does not show notable deviation from a standard Gaussian distribution. Light management plays a crucial role in the effort to improve the overall conversion efficiency of solar cells and light emitting diodes (LEDs). The subject transparent wood composites, with their unique light management capability, can serve as an effective transparent coating or substrate materials for building integrated photovoltaic.

Figure 12A:
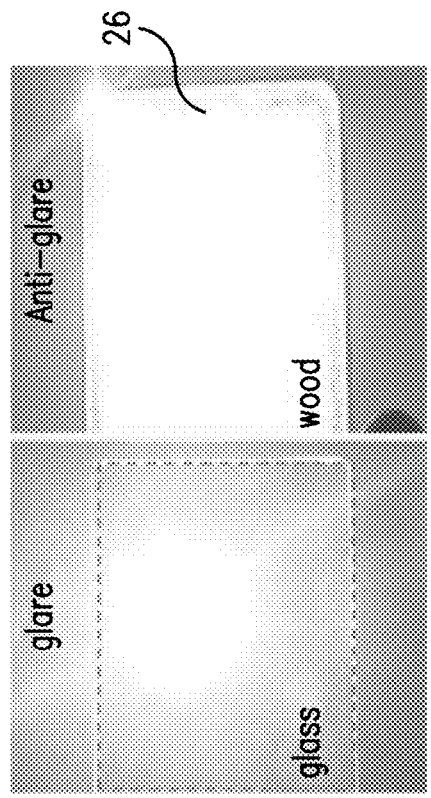
FIG. 12A is a diagram representative of the transmittance percentage vs. haze percentage of standard glass, transparent paper, and the subject transparent wood composite, respectively.
Figure 12B:
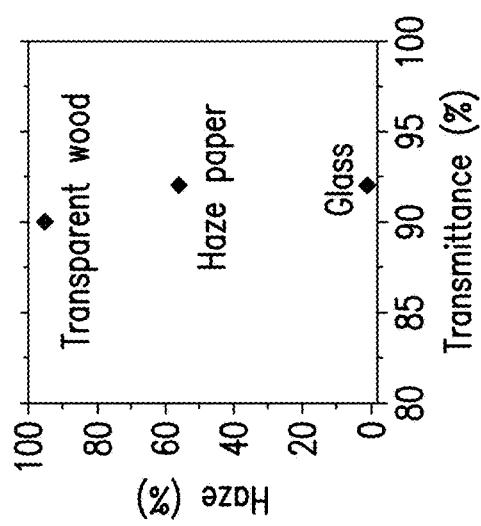
FIG. 12B is a photographic evidence of the problematic glaring effect with glass in comparison with the uniform and comfortable lighting through the transparent wood composite.

FIG. 12A is representative of comparison studies of the haziness of transparent wood, haze paper, and glass. In addition to the high transmittance, the haze of the transparent wood composite reaches 95% and is much higher than that of the ultrahigh haze nanopaper, which exhibits a typical haze value of ≈60%. In order to demonstrate the performance of a transparent wood window as an efficient daylight harvesting building material with high haze and high transmittance, a wooden house model (FIG. 12C) was built with a transparent wood roof 8 cm×12 cm. Sources of glare include the morning and evening positions of the sun, ice, reflective surfaces on cars, highly polished floors, and the windows of nearby buildings. Glare can interfere with the clarity of a visual image. When used for daily applications, the transparent wood is shown to provide an effective antiglaring effect. When looking through the transparent wood composite 26, glare is completely removed while a more uniform brightness is obtained as demonstrated in FIG. 12B.

Figure 12C:
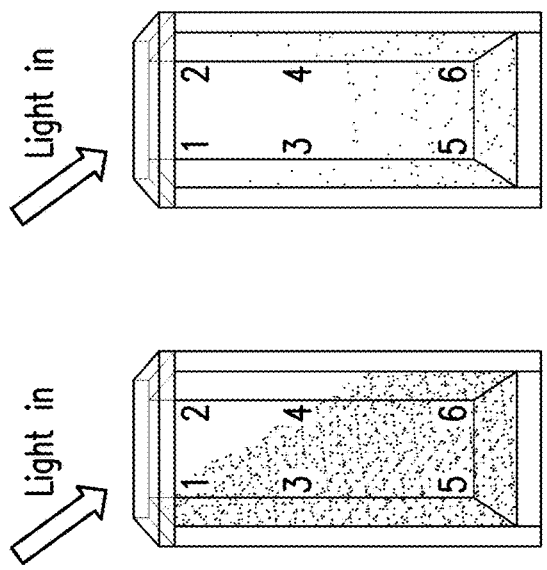
FIG. 12C is photographic evidence of the uniform light distribution inside the house model when using the subject transparent wood composite as daylight harvesting roof top in comparison with glass.

In FIG. 12C, the effectiveness of using soda-lime glass and transparent wood, respectively, is compared as a light harvesting roof A solar simulator from Oriel Instruments-Newport was used as the white light source. When incorporating a light harvesting building material into the house model, uniform indoor illumination was observed. In comparison to a glass rooftop, the high haze and high transparency of the wood composite resulted in maximized sunlight harvesting and a much consistent light distribution over the course of a day.

Figure 12D:
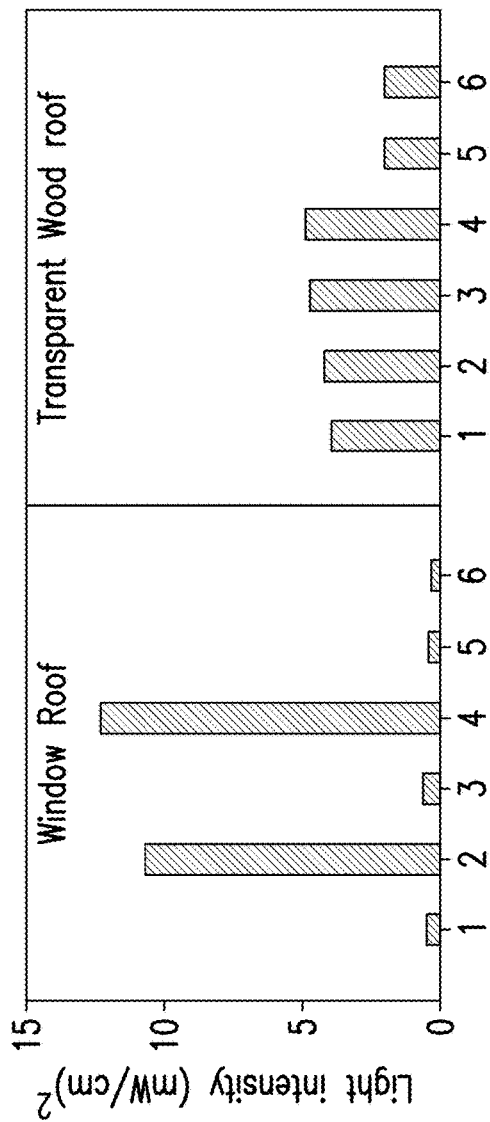
FIG. 12D is a diagram representative of the light intensity distribution of the glass roof vs. the transparent wood composite roof.

A calibrated Si detector from Thorlabs was used to evaluate the light distribution inside the house model. Six different spots were selected and marked as 1-6 for the glass top house and the transparent wood top house, respectively. The results are shown in FIG. 12D. The maximum light intensity inside the glass roof house is 12.3 mW cm$^{-2}$ while the minimum light intensity is only 0.35 mW cm$^{-2}$, making the illumination non-uniformity greater than 35. On the contrary, for the house with the transparent wood rooftop, the light intensity difference between brightest corner (4.9 mW cm$^{-2}$) over the darkest corner (2.1 mW cm$^{-2}$) is 2.3. The transparent wood building material has been experimentally shown to be an effective solution to save indoor lighting energy and to provide uniform illumination with enhanced visual comfort and privacy protection due to its intrinsic haziness.

In addition to the requirement for daylight harvesting and mechanical strength, transparent building materials must also meet the requirements for climate protection. Building materials for providing enhanced thermal insulation are therefore highly desirable. Effective insulation retards the flow of heat through the building shell and provides a structural barrier between the house and outside environment. If well insulated, the house stays warmer in the winter and cooler in the summer.

The walls of most residential and commercial buildings are generally well insulated with materials such as wood and composite foam. However, transparent building materials such as glass have a much higher thermal conductivity which results in higher heat flow than the surrounding materials and an overall reduction in thermal insulation of the building. Thermal insulation from windows is particularly important since thermal bridging across transparent windows and roofs that are made of glass can reduce energy efficiency and allow condensation. Current strategies to reduce heat loss through windows such as multiple layer glazing are often costly and can add significant weight. On the other hand, wood is a natural insulator with air pockets in the cell structure.

Figure 13B:
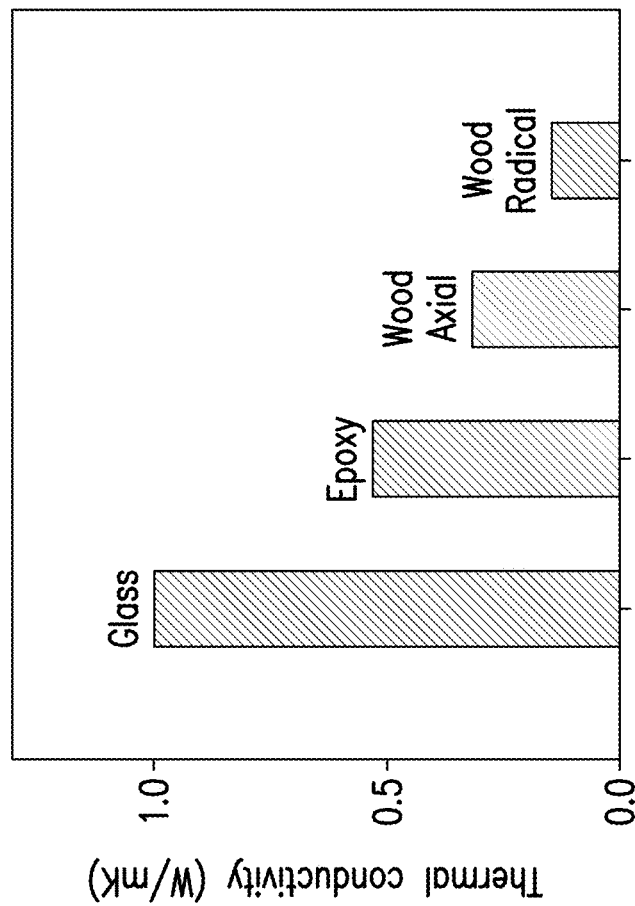
FIG. 13B is a diagram of the measured thermal conductivities of the standard glass, epoxy, axial and radial directions of the transparent wood, respectively.
Figure 13A:
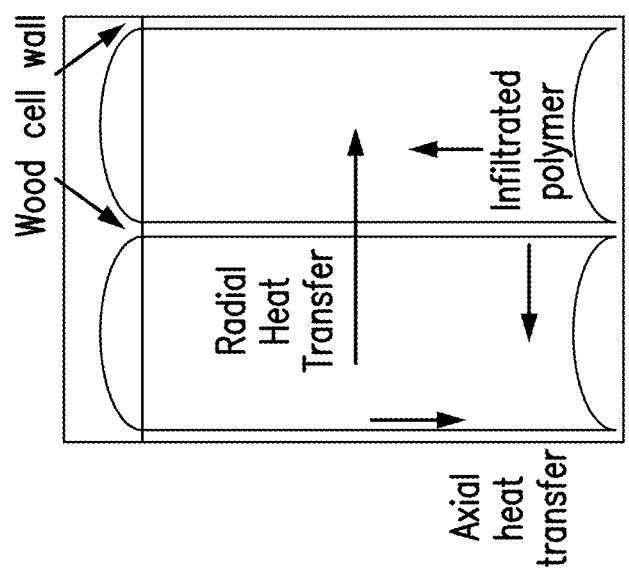
FIG. 13A is an illustration of the radial and axial heat transport in the transparent wood composite.

As shown in FIG. 13A, the transparent wood composites provide a high resistance to phonon traveling in the wood fiber microstructure. The radial heat travelling pathway yields an even larger phonon scattering effect than that in the axial direction. The anisotropic thermal properties of the transparent wood can be attributed to the alignment of wood cells, which has been well-preserved after lignin removal and polymer infiltration.

As can be seen in FIG. 13B, a thermal conductivity of around 0.32 W m$^{-1}$ K$^{-1}$ was measured in the axial direction and 0.15 W m$^{-1}$ K$^{-1}$ in the radial direction, comparable to the thermal conductivity of original basswood. A bulk polymer block (the same polymer that has been infiltrated into wood) shows a higher thermal conductivity of around 0.53 W m$^{-1}$K$^{-1}$. The resulting lower thermal conductivity of transparent wood is due to the high phonon resistance across the wood cell walls (mainly cellulose and hemicellulose) and the multiple interfaces phonon scattering effect. The mechanical properties can further be tuned by the choice of the infiltrating materials. In contrast, glass (Fisher Scientific Microscopic Glass) has a much higher thermal conductivity measured to be ≈1.0 W m$^{-1}$K$^{-1}$ (FIG. 13B), showing that the transparent wood is more effective in reducing conductive heat flow.

In addition to their extreme light management capability, the mechanical properties of the transparent wood composites have been investigated. Glass has presented significant safety concerns when used as a building block for residential and commercial structures. When glass undergoes a sudden impact such as flying debris, an earthquake, or even sudden movement of the occupants, glass can break and spray shattered pieces. Sometimes, glass can have sudden and spontaneous failure caused by edge or surface damage which propagates through creep loads. The breaking of glass requires immediate maintenance and attention, since the shattered glass presents severe safety issues. On the other hand, wood can withstand higher impact owing to the Van der Waals interactions between the cellulose and the energy absorbing polymer infiltrated microstructure.

FIG. 14A shows the resulting morphology of glass and transparent wood 26 after fracture due to a sudden hit from a dropping sharp object. The glass shattered immediately into pointed pieces while the shock-resistant transparent wood stays intact. Glass is fairly rigid, but can be brittle as well. When glass is under a load it can only accommodate stress to a relatively low level and then suddenly fail. Once a crack starts in glass, there is little within its structure to stop it from propagating. Consequently, glass exhibits a linear curve in strain and stress curve as shown in FIG. 14B. In contrast, the subject transparent wood composite possesses a much higher strain of 6%, more than two orders higher than that of standard soda-lime glass. This substantial increase in ductility is highly desirable for the application as a structural material. Even after breaking upon a sudden impact, the transparent wood is only bent and split instead of shattering into multiple sharp pieces. For commercial application as a building material, the transparent wood is also required to be water-resistant.

The transparent wood sample 26 was immersed in water as shown in FIG. 14C. After 72 hours, the sample was intact without any shape distortion or any degradation in mechanical and optical properties. The SEM observation of the epoxy filled wood walls and the mechanical properties of the transparent wood after 72 hours of water immersion have additionally been studied. The results show that water has negligible effect on the properties of the transparent wood potentially due to the encapsulation of the polymer component.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of the elements may be reversed or interposed, all without departing from the spirit or scope of the invention as defined in the appended claims.

What is being claimed is:

1. A method of fabrication of a wood-based light transmitting system, comprising steps of:
    (a) pre-cutting a wood block from a natural wood in a pre-determined angular relationship to natural internal channels of the natural wood to obtain a pre-cut wood block, the natural internal channels having walls formed from cellulose-containing material and being filled with lignin,
    (b) removing the lignin from natural internal channels of said pre-cut wood block, thus forming a lignin-devoid wood block, and
    (c) sequentially infiltrating said natural internal channels in said lignin-devoid wood block with a filling polymer so as to obtain a wood composite member,
    wherein a refractive index of the filling polymer is such that the wood composite member is transparent and has a transmittance from 85% to 95% for light having a wavelength in a range of 400 nm to 1100 nm,
    wherein the filling polymer is polyvinylpyrrolidone,
    wherein the transparent wood composite member has an optical haze from 85% to 100% for light having a wavelength in the range of 400 nm to 1100 nm,
    wherein the step (b) comprises:
    preparing a lignin removal solution by mixing a solution of NaOH in deionized water, and a solution of $Na_2SO_3$ in deionized water,
    boiling said pre-cut wood block in said lignin removal solution,
    rinsing said pre-cut wood block in hot distilled water, and
    boiling said rinsed pre-cut wood block in a bleaching solution containing a solution of $H_2O_2$ in distilled water until a color of the pre-cut wood block disappears,
    thereby obtaining the lignin-devoid wood block; and
    wherein the step (c) comprises:
    immersing said lignin-devoid wood block in a container of said filling polymer in a liquid phase thereof,
    degassing said liquid filling polymer under a pressure of 200 Pa,
    applying atmospheric pressure to the liquid filling polymer to promote infiltration of the filling polymer into the internal channels of the lignin-devoid wood block,
    repeating said atmospheric pressure application at least once, thus obtaining a liquid polymer infiltrated wood block,
    maintaining the liquid polymer infiltrated wood block in said container undisturbed at a temperature of 30° C.-60° C. until the filling polymer solidifies, thus obtaining a solid polymer infiltrated wood block, and
    removing said solid polymer infiltrated wood block from the container, thus obtaining said transparent wood composite member.

2. The method of claim 1, further comprising:
    providing a solar cell having an optically active layer, depositing ethanol on a surface of said optically active layer, placing said transparent wood composite member on said optically active layer in contact therewith, thus forming a sandwich structure, and drying the sandwich structure containing said transparent wood composite member coupled to said optically active layer so as to attach said transparent wood composite member to the solar cell.

3. The method of claim 1, further comprising:

attaching said transparent wood composite member to a building at a site of at least one of a window and a roof.

4. The method of claim 1, wherein the filling polymer has a refractive index of 1.53 at a wavelength of 550 nm.

5. The method of claim 1, wherein a difference between a refractive index of the cellulose-based walls and the refractive index of the polymer after the step (b) is less than or equal to 0.05.

6. The method of claim 1, wherein a thickness of the block of the delignified wood is at least 100 μm.

* * * * *